(12) United States Patent
Yang

(10) Patent No.: US 9,941,153 B1
(45) Date of Patent: Apr. 10, 2018

(54) PAD STRUCTURE AND MANUFACTURING METHOD THEREOF

(71) Applicant: MACRONIX International Co., Ltd., Hsinchu (TW)

(72) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/388,338

(22) Filed: Dec. 22, 2016

(51) Int. Cl.
| | |
|---|---|
| *H01L 23/48* | (2006.01) |
| *H01L 21/768* | (2006.01) |
| *H01L 23/522* | (2006.01) |
| *H01L 23/528* | (2006.01) |
| *H01L 23/532* | (2006.01) |
| *H01L 21/027* | (2006.01) |

(52) U.S. Cl.
CPC .... *H01L 21/76816* (2013.01); *H01L 21/0273* (2013.01); *H01L 21/76877* (2013.01); *H01L 23/5226* (2013.01); *H01L 23/5283* (2013.01); *H01L 23/5329* (2013.01); *H01L 23/53257* (2013.01); *H01L 23/53271* (2013.01)

(58) Field of Classification Search
CPC ........... H01L 21/76816; H01L 21/0273; H01L 21/76877; H01L 23/5226; H01L 23/5283; H01L 23/53257; H01L 23/53271; H01L 23/5329
See application file for complete search history.

(56) References Cited

U.S. PATENT DOCUMENTS

| | | | | |
|---|---|---|---|---|
| 2013/0234232 A1* | 9/2013 | Yahashi | ................ | H01L 21/768 257/324 |
| 2015/0255385 A1 | 9/2015 | Lee et al. | | |

OTHER PUBLICATIONS

"Office Action of Taiwan Counterpart Application," dated Apr. 26, 2017, p. 1-p. 4.

* cited by examiner

*Primary Examiner* — Victor A Mandala
*Assistant Examiner* — Colleen E Snow
(74) *Attorney, Agent, or Firm* — J.C. Patents

(57) ABSTRACT

A pad structure including a plurality of material pairs and a plurality of pads is provided. The material pairs are stacked on a substrate to form a stair step structure. A stair step of the stair step structure includes one of material pairs. Each of the material pairs includes a conductive layer and a dielectric layer on the conductive layer. Each of the pads is embedded in one stair step of the stair step structure and exposed by the dielectric layer corresponding to the one stair step and another stair step above the one stair step. A thickness of one of the pads is greater than a thickness of one of the conductive layers.

16 Claims, 23 Drawing Sheets

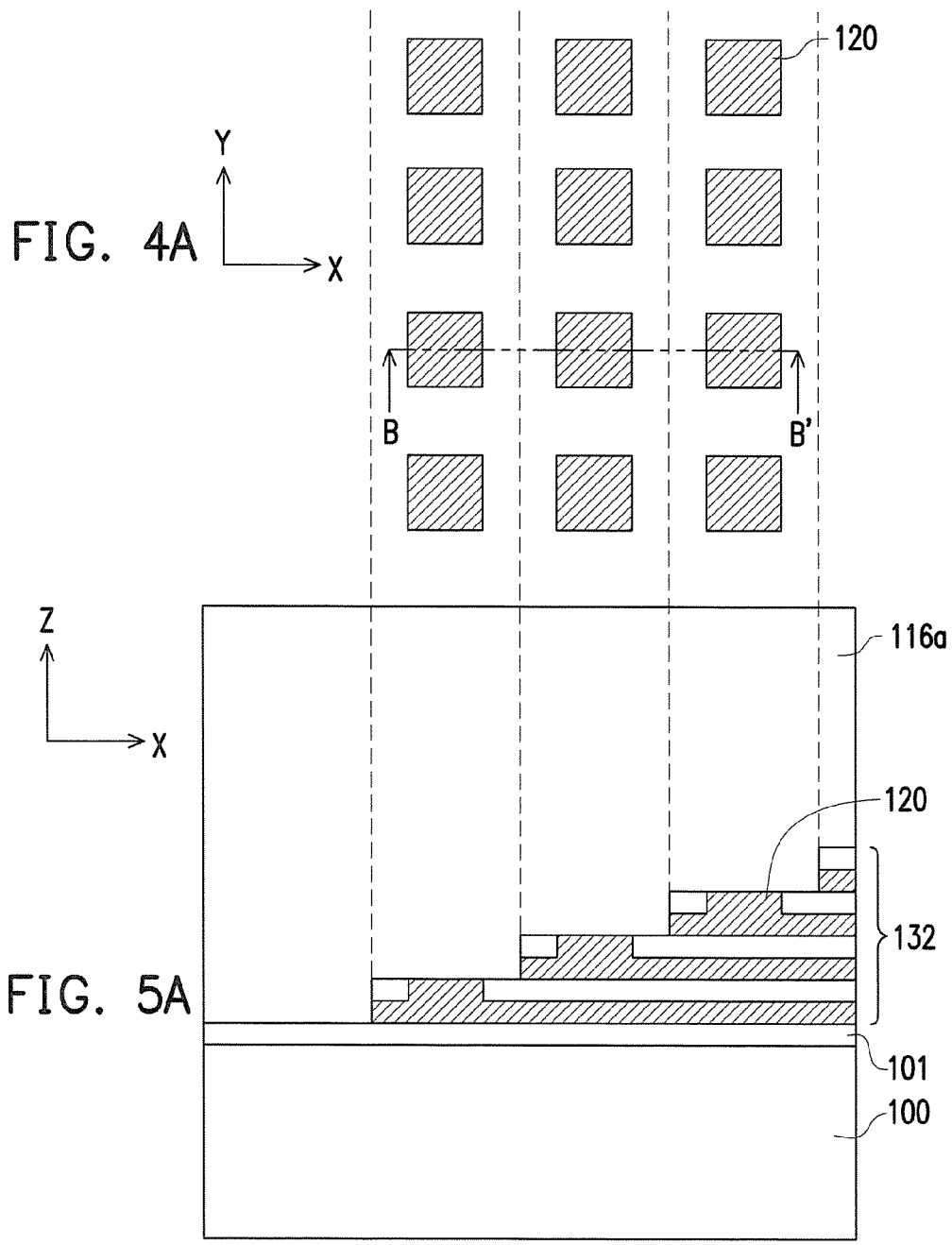

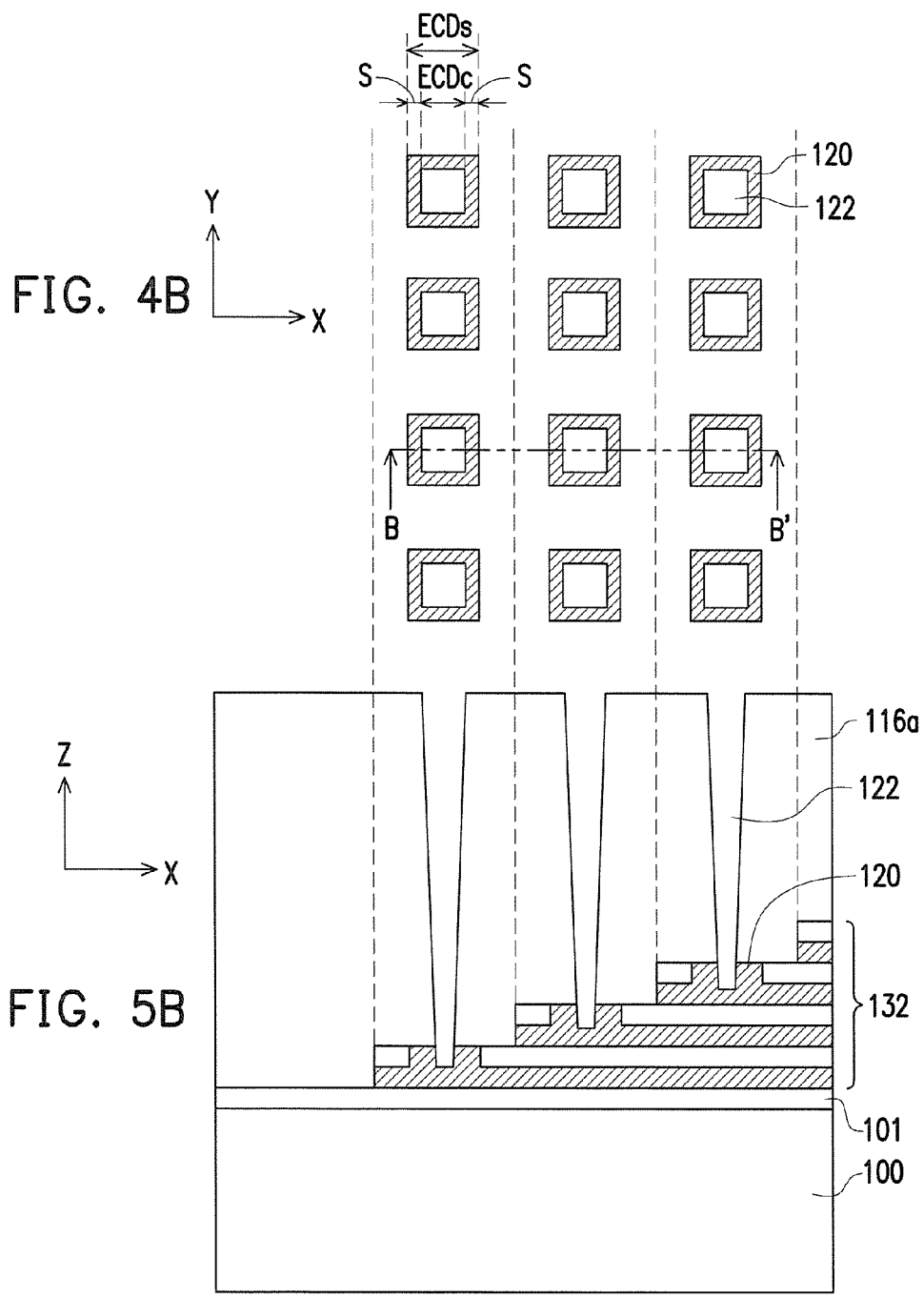

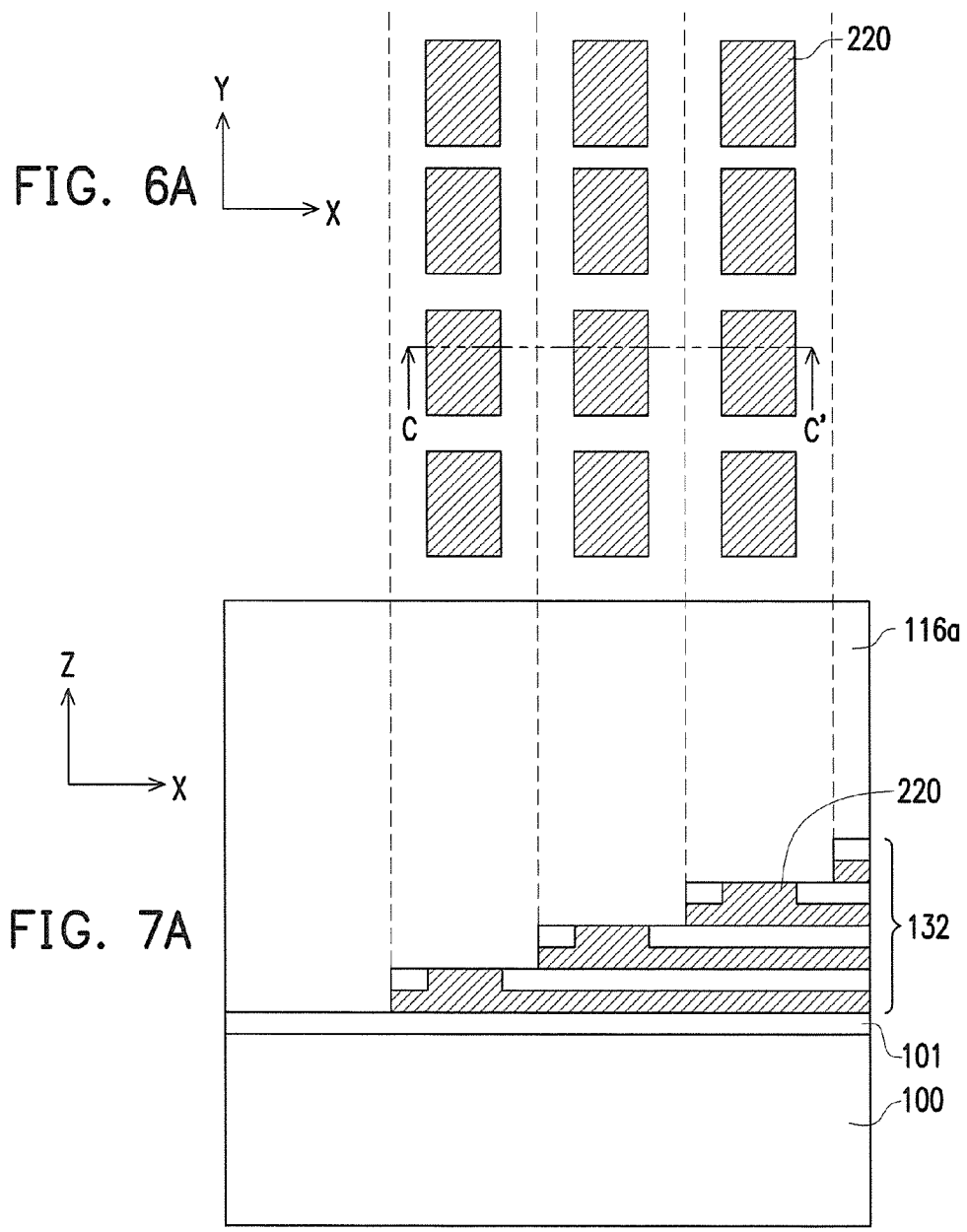

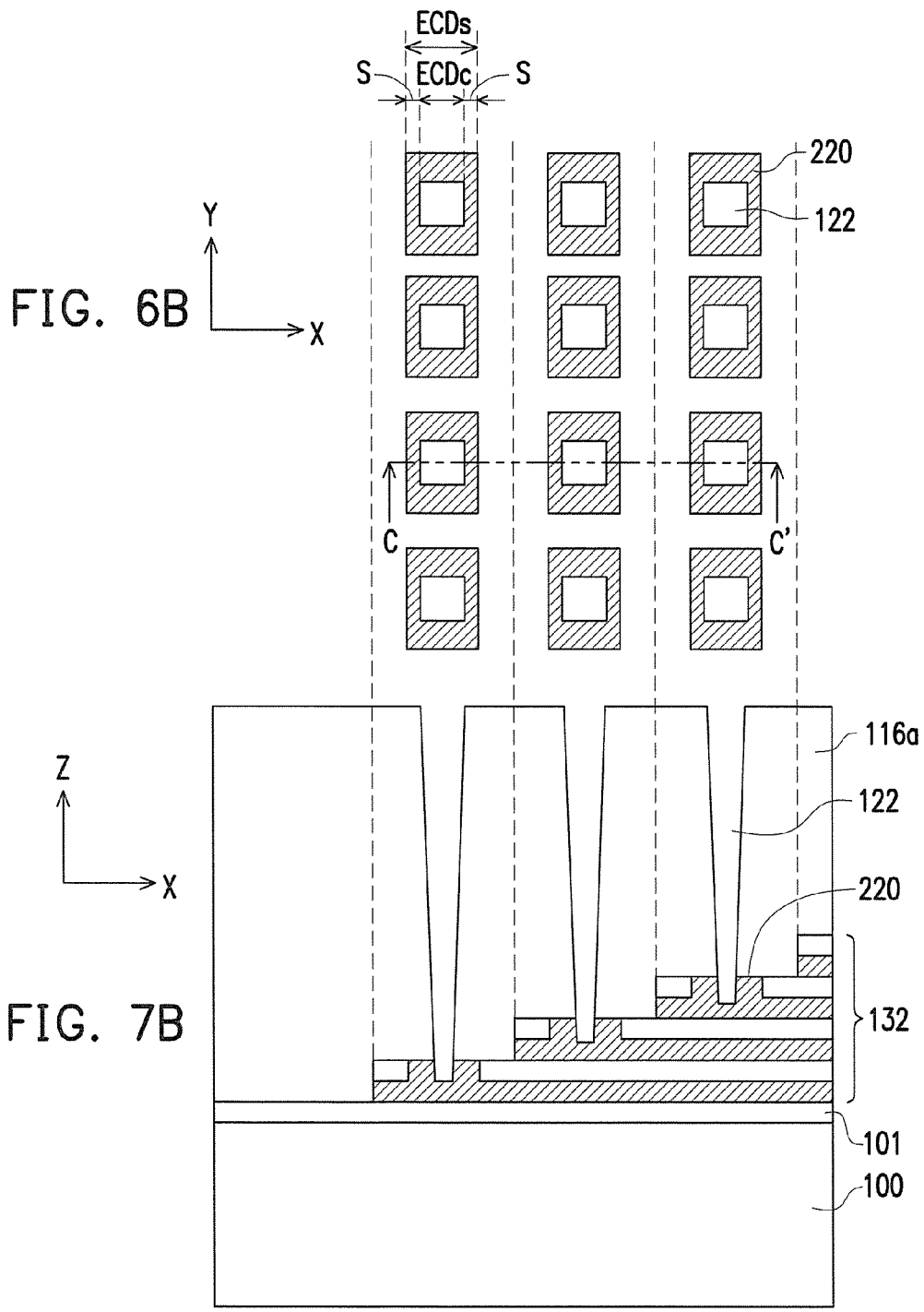

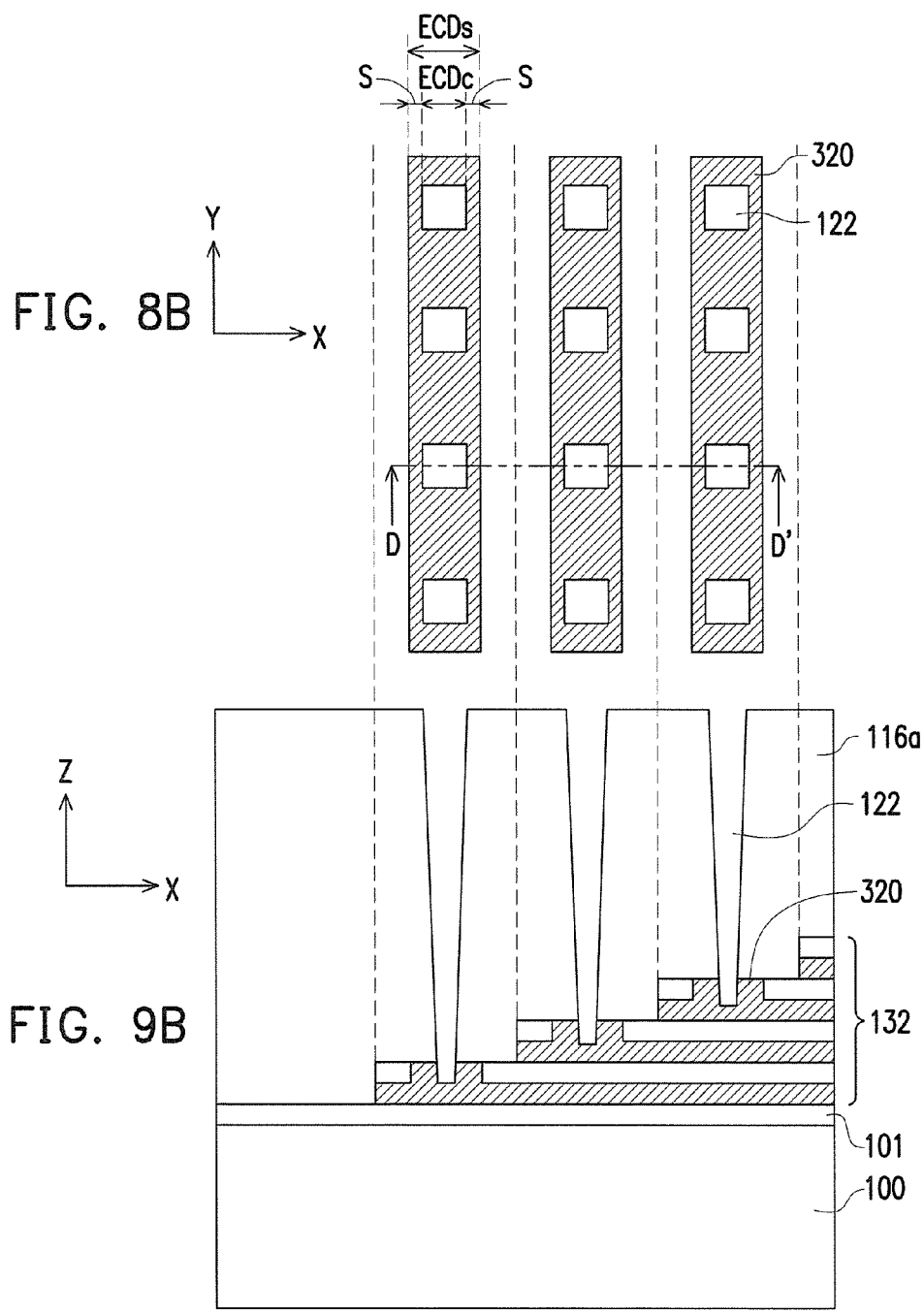

PAD STRUCTURE AND MANUFACTURING METHOD THEREOF

FIELD OF THE INVENTION

The invention relates to a pad structure and a manufacturing method thereof; more particularly, the invention relates to a pad structure applied to a three-dimensional (3D) memory device and a manufacturing method of the pad structure.

DESCRIPTION OF RELATED ART

With the integration of memory devices, in order to achieve high density and high performance, it is more and more common to replace two-dimensional memory devices with 3D memory devices. One of the 3D memory devices is the vertical memory device. The memory capacity per unit area in the vertical memory device is increased, while the interconnection difficulty in the vertical memory device is increased as well.

In general, conductive layers with a stair step structure often serves as pads in the 3D memory device, and the pads and contacts thereon often act as the interconnection structures to connect components in each layer to other components. However, during a process of etching the contacts, the pad at the top of the stacked structure may be over-etched due to the height difference between the pads at different locations in the stair step structure and the top surface of the dielectric layer on the pads, such that the contact openings penetrate the pad at the top and extend to the conductive layer below the pad at the top. Thereby, in the subsequently formed contacts, two pads or two conductive layers may be electrically connected, which may lead to electrical failures to the components. Hence, how to develop a pad structure and a manufacturing method thereof while preventing the pad structure having the stair step structure from over-etching is an important issue that needs to be addressed.

SUMMARY OF THE INVENTION

The invention provides a pad structure having a stair step structure and a manufacturing method of the pad structure to prevent electrical failures caused by over-etching during a process of manufacturing contact openings.

The invention provides a pad structure having a stair step structure and a manufacturing method of the pad structure to improve fabrication window and yield.

In an embodiment of the invention, a pad structure including a plurality of material pairs and a plurality of pads is provided. The material pairs are stacked on a substrate to form a stair step structure. A stair step of the stair step structure includes one of the material pairs. Each of the material pairs includes a conductive layer and a dielectric layer on the conductive layer. Each of the pads is embedded in one of the stair steps of the stair step structure and exposed by the dielectric layer corresponding to the one stair step and another stair step above the one stair step. A thickness of one of the pads is greater than a thickness of one of the conductive layers.

According to an embodiment of the invention, the material pairs extend along an X-Y plane. One of the material pairs protrudes from a side of another of the material pairs above the one of the material pairs and exposes a surface of a corresponding pad of the pads.

According to an embodiment of the invention, the pad structure further includes a plurality of plugs extending along a Z direction, and the plugs are respectively arranged on the pads.

According an embodiment of the invention, a thickness of each of the pads is greater than a bottom width of a corresponding plug of the plugs.

According to an embodiment of the invention, a material of the plugs is the same as a material of the pads.

According to an embodiment of the invention, a material of the plugs is different from a material of the pads.

According to an embodiment of the invention, a shape of the pads observed at a top view angle includes a square shape, a circular shape, a rectangular shape, a bar shape, or a combination thereof.

According to an embodiment of the invention, when a shape of the pads observed at a top view angle is a bar shape, the pads are arranged along an X direction and extend along a Y direction.

According to an embodiment of the invention, the pad structure further includes a pad layer located between the stair step structure and the substrate.

In an embodiment of the invention, a manufacturing method of a pad structure includes following steps. A stacked structure is formed on a substrate. The stacked structure includes a plurality of stacked material pairs. The material pairs include a first material pair to an $N^{th}$ material pair from top to bottom, and N is an integer greater than 1. Each of the material pairs includes a first layer and a second layer located on the first layer. Plural first openings are formed in the first material pair. The first openings expose a top surface of the second material pair. A patterning process is performed to pattern the stacked structure and form a stair step structure, and a second opening is formed in each of a plurality of stair steps of the stair step structure. Locations of orthogonal projections of the second openings respectively correspond to locations of the first openings. The second openings are filled with a plurality of third layers respectively, and a thickness of one of the third layers is greater than a thickness of one of the first layers.

According to an embodiment of the invention, after the second openings are filled with the third layers respectively, the manufacturing method further includes following steps. A dielectric layer is formed on the substrate. The dielectric layer covers a surface of the stair step structure and top surfaces of the third layers. A plurality of contact openings are formed in the dielectric layer. The contact openings respectively expose the top surfaces of the third layers. The contact openings are filled with a plurality of plugs respectively, such that one of the plugs is connected to a corresponding third layer of the third layers.

According to an embodiment of the invention, each of the first layers includes silicon nitride, each of the second layers includes silicon oxide, and each of the third layers includes silicon nitride.

According to an embodiment of the invention, after the dielectric layer is formed on the substrate and before the contact openings are formed, the manufacturing method further includes performing a tungsten replacement process to replace the first layers and the third layers with tungsten (W).

According to an embodiment of the invention, the tungsten replacement process further includes following steps. At least one slit is formed in the dielectric layer and the stair step structure. The at least one slit extends to a bottom surface of the stair step structure, so as to expose a partial cross-section of the first layers of the material pairs. An etchant is added into the at least one slit, and the first layers and the third layers are removed to form a plurality of gaps. A deposition process is performed to form a plurality of W layers in the gaps respectively.

According to an embodiment of the invention, each of the first layers includes polysilicon, each of the second layers includes silicon oxide, and each of the third layers includes polysilicon.

According to an embodiment of the invention, each of the plugs includes W.

According to an embodiment of the invention, the step of performing the patterning process is described below. A photoresist layer is formed on the stacked structure. One of the first openings is exposed by the photoresist layer. A first etching process is performed, and a portion of the first material pairs and a portion of the second material pairs are removed, so as to transfer a shape of the one of the first openings into the second material pairs. The photoresist layer is trimmed to expose another one of the first openings. A second etching process is performed, and a portion of the first material pairs, a portion of the second material pairs, and a portion of the third material pairs are removed, so as to transfer a shape of the another one of the first openings into the second material pairs and transfer the shape of the one of the first openings into the third material pairs. The step of trimming the photoresist layer and the step of performing the second etching process are repeated until the stair step structure is formed.

According to an embodiment of the invention, the manufacturing method of the pad structure further includes forming a pad layer between the stair step structure and the substrate.

In view of the above, plural openings are formed in a topmost material pair of the stacked structure according to an embodiment of the invention. The stacked structure is patterned to form the stair step structure, and the openings are transferred and formed in each stair step of the stair step structure. The openings are then filled with a conductive material to form the pads. Compared to the conventional pads, the pads provided herein have larger thickness, so as to prevent electrical failures caused by over-etching during the process of manufacturing the contact openings. Besides, the thicker pads used as the etching stop layer of forming the contact openings may increase the fabrication window and the yield of the manufacturing process of the contact openings.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4A and FIG. 4B are schematic top views illustrating a manufacturing process of a pad structure according to a first embodiment of the invention.

FIG. 5A and FIG. 5B are schematic cross-sectional views taken along a line B-B' depicted in FIG. 4A and FIG. 4B.

FIG. 6A and FIG. 6B are schematic top views illustrating a manufacturing process of a pad structure according to a second embodiment of the invention.

FIG. 7A and FIG. 7B are schematic cross-sectional views taken along a line C-C' depicted in FIG. 6A and FIG. 6B.

FIG. 8A and FIG. 8B are schematic top views illustrating a manufacturing process of a pad structure according to a third embodiment of the invention.

FIG. 9A and FIG. 9B are schematic cross-sectional views taken along a line D-D' depicted in FIG. 8A and FIG. 8B.

DESCRIPTION OF EMBODIMENTS

Figure 1:
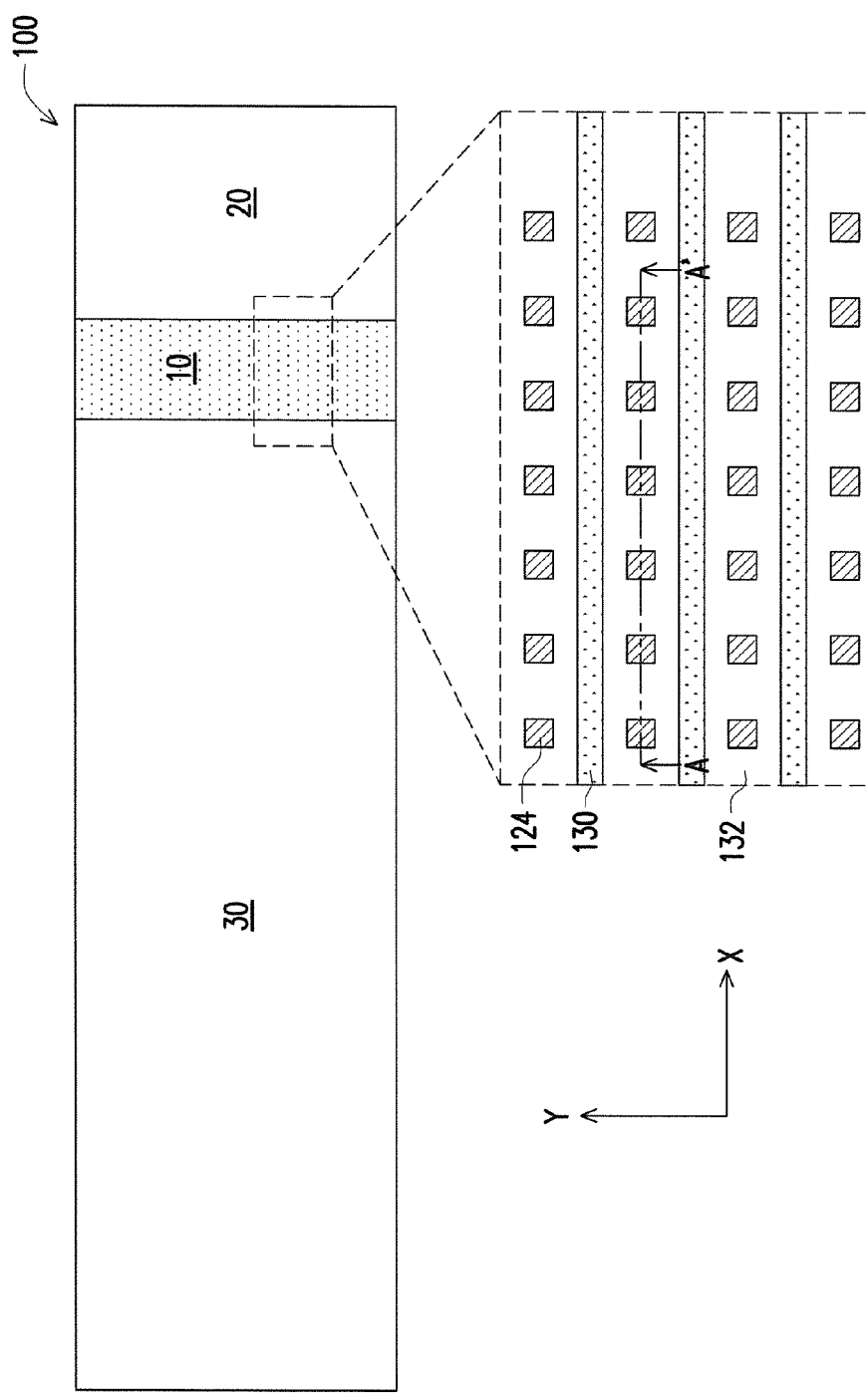
FIG. 1 is a schematic top view illustrating a memory device according to an embodiment of the invention.

The invention described in several embodiments is elaborated with reference to the accompanying drawings. Note that the invention may be embodied in various ways and should not be limited to the embodiments provided herein. The thicknesses of layers and regions provided in the drawings are enlarged for illustrative purposes. The same or similar reference numbers represent the same or similar components and thus will not be described in each and every paragraphs below.

Figure 2:
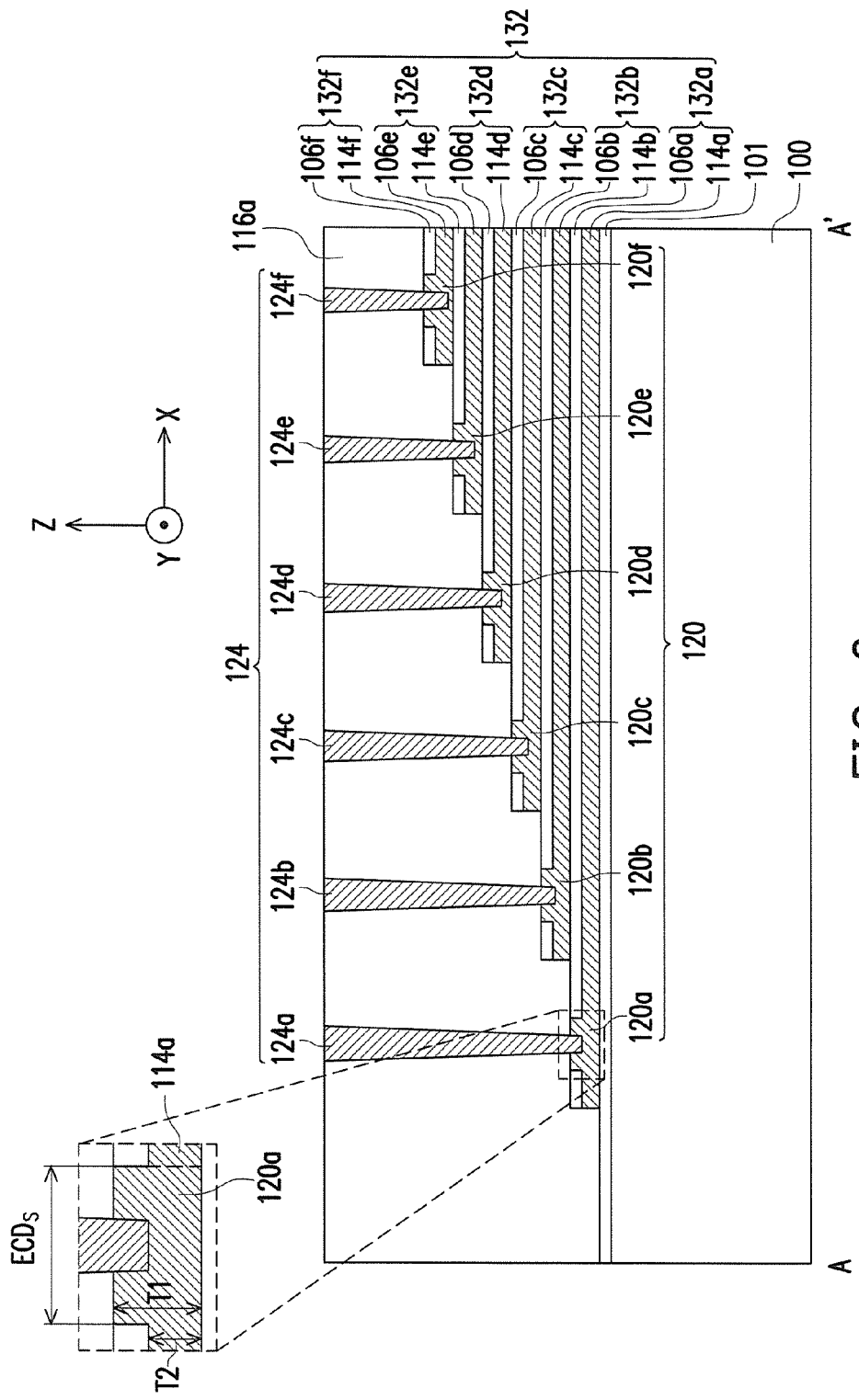
FIG. 2 is a schematic cross-sectional view taken along a line A-A' depicted in FIG. 1.

FIG. 1 is a schematic top view illustrating a memory device according to an embodiment of the invention. FIG. 2 is a schematic cross-sectional view taken along a line A-A' depicted in FIG. 1.

With reference to FIG. 1 and FIG. 2, the embodiment of the invention provides a memory device 10 that includes a substrate 100. The substrate 100 observed at a top view angle includes a pad region 10, an array region 20, and a peripheral region 30. The pad region 10 is located between the array region 20 and the peripheral region 30. In an embodiment, the array region 20 may be a memory cell array region, for example. The peripheral region 30 includes a plurality of low-voltage semiconductor devices, e.g., low-voltage n-type metal oxide semiconductor (LV-NMOS) transistors, low-voltage p-type metal oxide semiconductor (LV-PMOS) transistors, or a combination thereof. As shown in FIG. 2, the pad region 10 observed in a cross-sectional view includes a plurality of material pairs 132 having a stair step structure, a plurality of pads 120 respectively embedded in the material pairs 132, and a plurality of plugs 124 respectively arranged on the pads 120. The pads 120 and the plugs 124 may serve as interconnection structures to electrically connect components in each stair step of the stair step structure to other components.

Particularly, with reference to FIG. 1 and FIG. 2, the material pairs 132 extend from the array region 20 to the pad region 10 and are terminated at the pad region 10. The material pairs 132 extend along an X-Y plane and are stacked to form the stair step structure. A stair step of the stair step structure includes one of the material pairs. Each of the material pairs 132 includes a conductive layer (or a first layer) and a dielectric layer (or a second layer) on the conductive layer. For instance, as shown in FIG. 2, the conductive layer 114a and the dielectric layer 106a may be deemed as a material pair 132a or one stair step of the stair step structure, and the conductive layer 114b and the dielectric layer 106b may be deemed as another material pair 132b or another stair step of the stair step structure. The arrangement of other material pairs is similar to that provided above and thus will not be further explained below. In an embodiment of the invention, the conductive layer 114a and the dielectric layer 106a may be deemed as the bottommost material pair 132a of the stacked structure, and the material pair 132a protrudes from a side of the material pair 132b, such that the pad 120a embedded in the conductive layer 114a and the conductive layer 106a is exposed. Here, the material pair 132b is constituted by the conductive layer 114b and the dielectric layer 106b and located above the material pair 132a. Similarly, the material pair 132b constituted by the conductive layer 114b and the dielectric layer 106b protrudes from a side of the material pair 132c, such that the pad 120b embedded in the conductive layer 114b and the conductive layer 106b is exposed. Here, the material pair 132c is constituted by the conductive layer 114c and the dielectric layer 106c and located above the material pair 132b. The arrangement of other material pairs is similar to that provided above and thus will not be further explained below.

In another aspect, as shown in FIG. 2, the plugs 124 extend along a Z direction and are respectively arranged on the pads 120. For instance, the plug 124a is arranged on and connected to the pad 120a, such that the plug 124a is electrically connected to the conductive layer 114a through the pad 120a. Similarly, the plug 124b is arranged on and connected to the pad 120b, such that the plug 124b is electrically connected to the conductive layer 114b through the pad 120b. The arrangement of other plugs is similar to that provided above and thus will not be further explained below.

Besides, the pad region 10 further includes a plurality of slits 130 extending from the array region 20 to the pad region 10, and the slits are terminated at the pad region 10. Particularly, the slits 130 extend along the X direction and are arranged along the Y direction, such that each of the slits 130 is located between the plugs 124 in two adjacent rows (extending along the X direction). FIG. 1 shows the plugs 124 in a 7×4 array and three slits 130, which should not be construed as a limitation to the invention. In other embodiments, the numbers and the arrangement of the plugs 124 and the slits 130 may be adjusted according to actual designer's demands.

Note that the pads 120a-120f not only serve to electrically connect the plugs 124a-124f and the conductive layers 114a-114f but also act as etching stop layers during the manufacturing process of contact openings. For instance, as shown in the enlarged view of the pad 120a in FIG. 2, a thickness T1 of the pad 120a is greater than a thickness T2 of the conductive layer 120a; hence, the pad 120a with the larger thickness can effectively prevent the over-etching during the manufacturing process of the contact openings. Namely, even the topmost plug 124f of the stacked structure does not penetrate the topmost pad 120f of the stacked structure nor extends to the underlying conductive layer 114e. Since the pads 120 provided herein have larger thickness, electrical failures caused by over-etching during the process of manufacturing the contact openings can be prevented. The thickness T1 of the pad 120a may be in a range of 70 nm to 90 nm, for example.

Figure 3A:
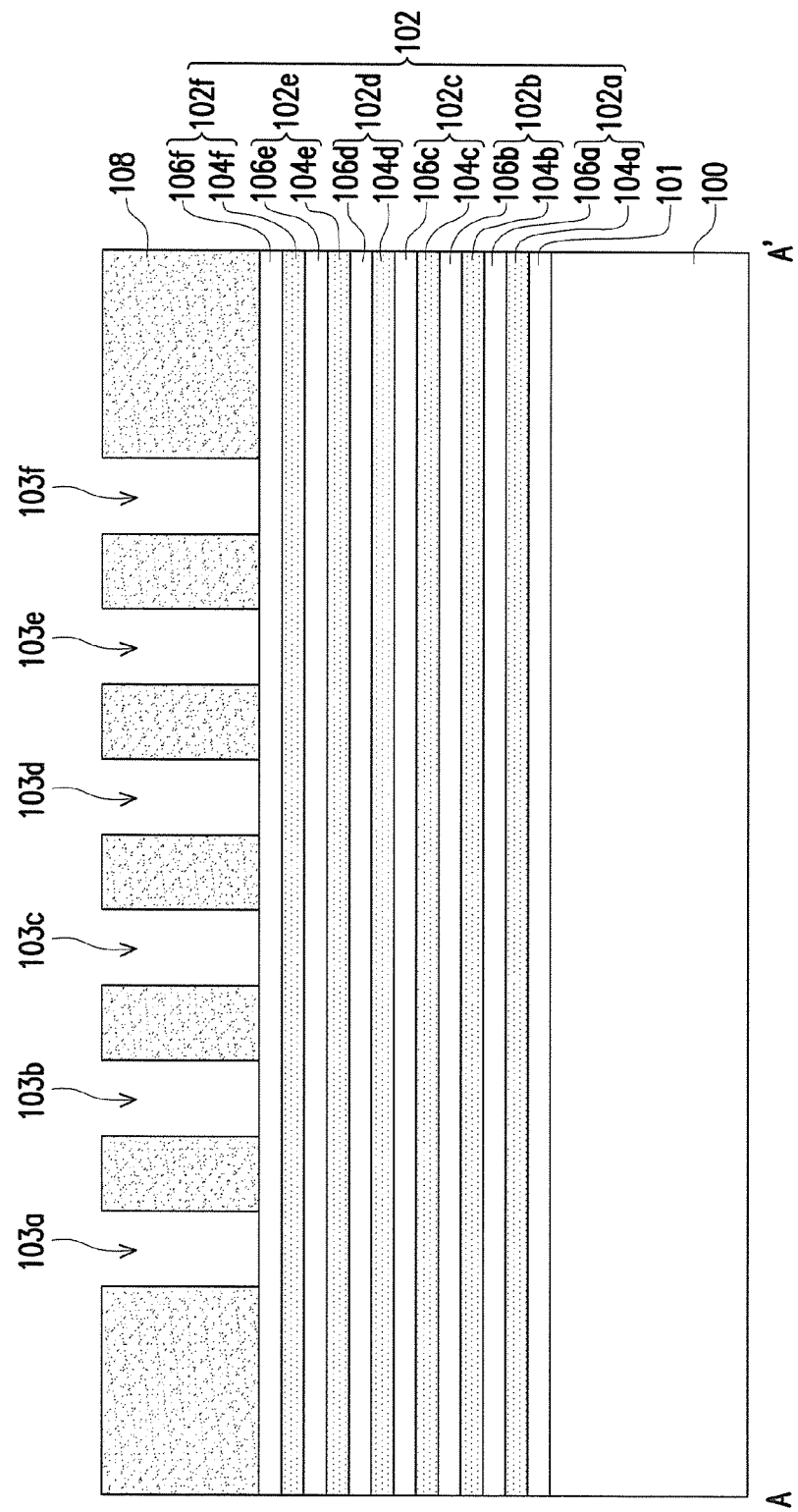
FIG. 3A to FIG. 3O are schematic cross-sectional views illustrating a manufacturing process and taken along the line A-A' depicted in FIG. 1.

FIG. 3A to FIG. 3O are schematic cross-sectional views illustrating a manufacturing process and taken along the line A-A' depicted in FIG. 1.

With reference to FIG. 3A, a substrate 100 is provided. In an embodiment of the invention, the substrate 100 is a semiconductor substrate, a semiconductor compound substrate, or a semiconductor over insulator (SOI) substrate, for example. The semiconductor is IVA group atoms, such as silicon or germanium, for example. The semiconductor compound is formed of IVA group atoms, such as silicon carbide or silicon germanium, or formed of IIIA group atoms and VA group atoms, such as gallium arsenide, for example.

A pad layer 101 is formed on the substrate 100. In an embodiment, the pad layer 101 may be a silicon oxide layer and may serve to protect the surface of the substrate 100.

A stacked structure 102 is formed on the pad layer 101. To be specific, the stacked structure 102 includes a plurality of stacked material pairs 102a-102f. As shown in FIG. 3A, the material pair 102a may be a bottommost material pair of the stacked structure, and the material pair 102f may be a topmost material pair of the stacked structure. The material pair 102a includes a first layer 104a and a second layer 106a located on the first layer 104a. Similarly, the material pair 102b includes a first layer 104b and a second layer 106b located on the first layer 104b. The arrangement of other material pairs 102c-102f is similar to that provided above and thus will not be further explained below. In another embodiment, the first layers 104a-104f may be silicon nitride layers, and the second layers 106a-106f may be silicon oxide layers. In an alternative embodiment, the first layers 104a-104f may be polysilicon layers, and the second layers 106a-106f may be silicon oxide layers. In an embodiment, a thickness of one of the first layers 104a-104f ranges from 20 nm to 40 nm, which may be 28 nm, for example. In an embodiment, a thickness of one of the second layers 106a-106f ranges from 40 nm to 60 nm, which may be 52 nm, for example. Although FIG. 3A illustrates 6 material pairs, the invention should not be not limited thereto. In other embodiments of the invention, the number of the material pairs may be 8, 15, 21, 27, 33, 39, or more.

A photoresist layer 108 is formed on the stacked structure 102. The photoresist layer 108 has a plurality of openings 103a-103f. The openings 103a-103f expose the top surface of the stacked structure 102 (or the second layer 106f). Locations of the openings 103a-103f respectively correspond to locations of the subsequently formed pads 120a-120f (as shown in FIG. 3O). Namely, locations of orthogonal projections of the openings 103a-103f are overlapped with the locations of the subsequently formed pads 120a-120f.

Figure 3B:
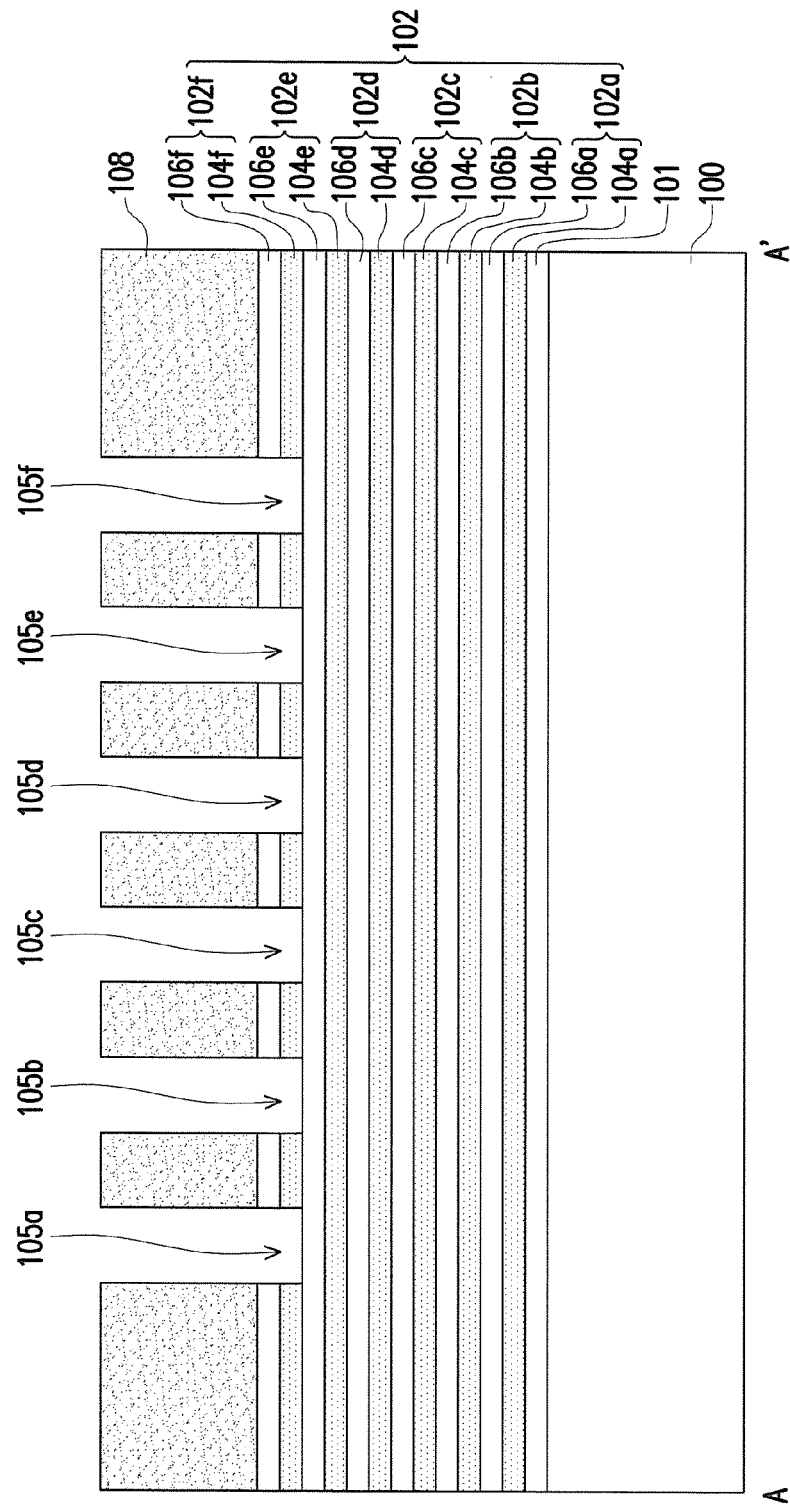

With reference to FIG. 3A and FIG. 3B, an etching process is performed by using the photoresist layer 108 as a mask, and a portion of the material pair 102f is removed, so as to form a plurality of openings 105a-105f in the material pair 102f. The openings 105a-105f expose the top surface of the material pair 102e (or the second layer 106e). In an embodiment of the invention, the etching process may include a dry etching process, e.g., a reactive ion etching (RIE) process, for instance.

Figure 3C:
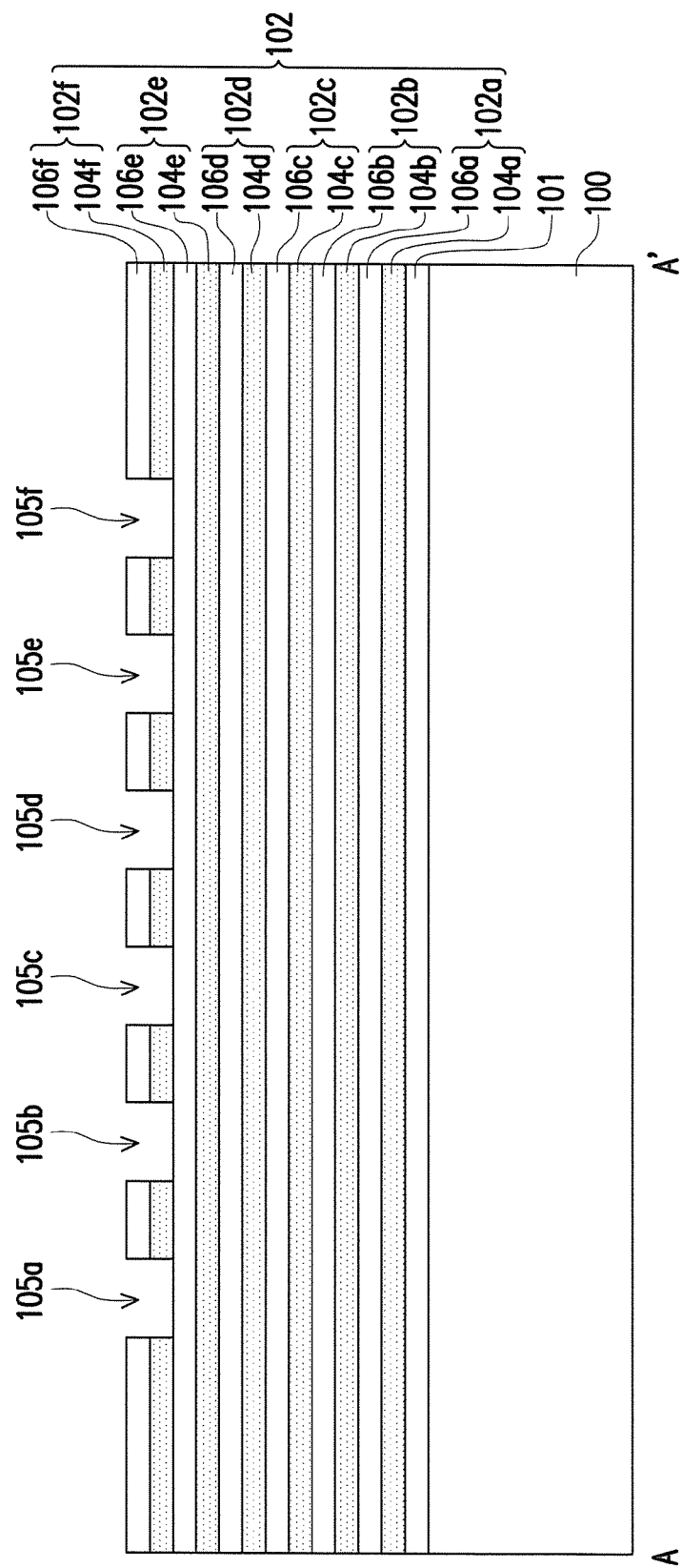

With reference to FIG. 3B and FIG. 3C, the photoresist layer 108 is removed. In an embodiment of the invention, a method of removing the photoresist layer 108 may include ashing the photoresist layer 108 with use of high-density plasma and then performing a wet cleansing process.

With reference to FIG. 3C to FIG. 3I, a patterning process is performed to pattern the stacked structure 102 and form a stair step structure 102'. Particularly, with reference to FIG. 3C and FIG. 3D, a photoresist layer 110 is formed on the stacked structure 102. The photoresist layer 110 exposes the opening 105a and covers the other openings 105b-105f. In an embodiment, a thickness or a height H1 of the photoresist layer 110 may be in a range of 4000 nm to 6000 nm, for instance.

Figure 3D:
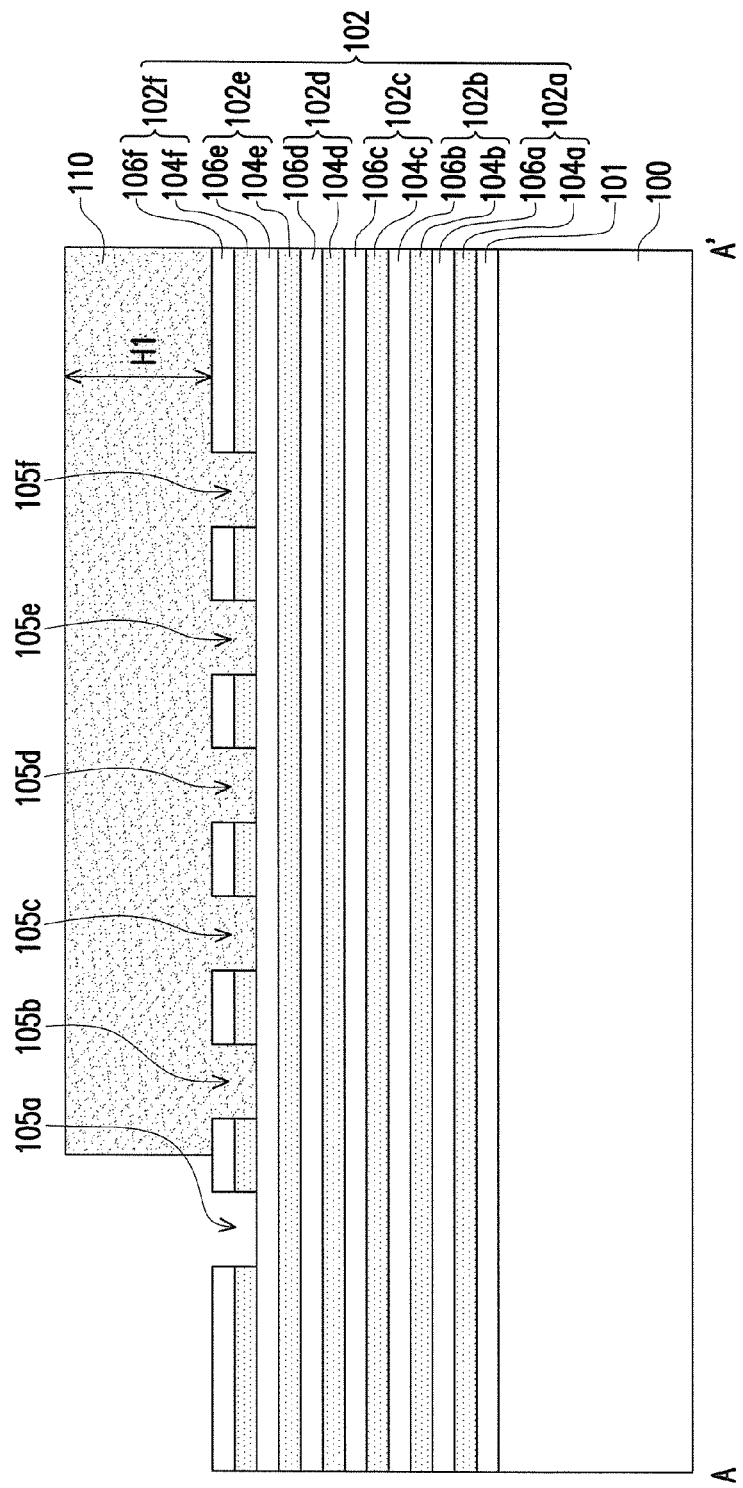
Figure 3E:
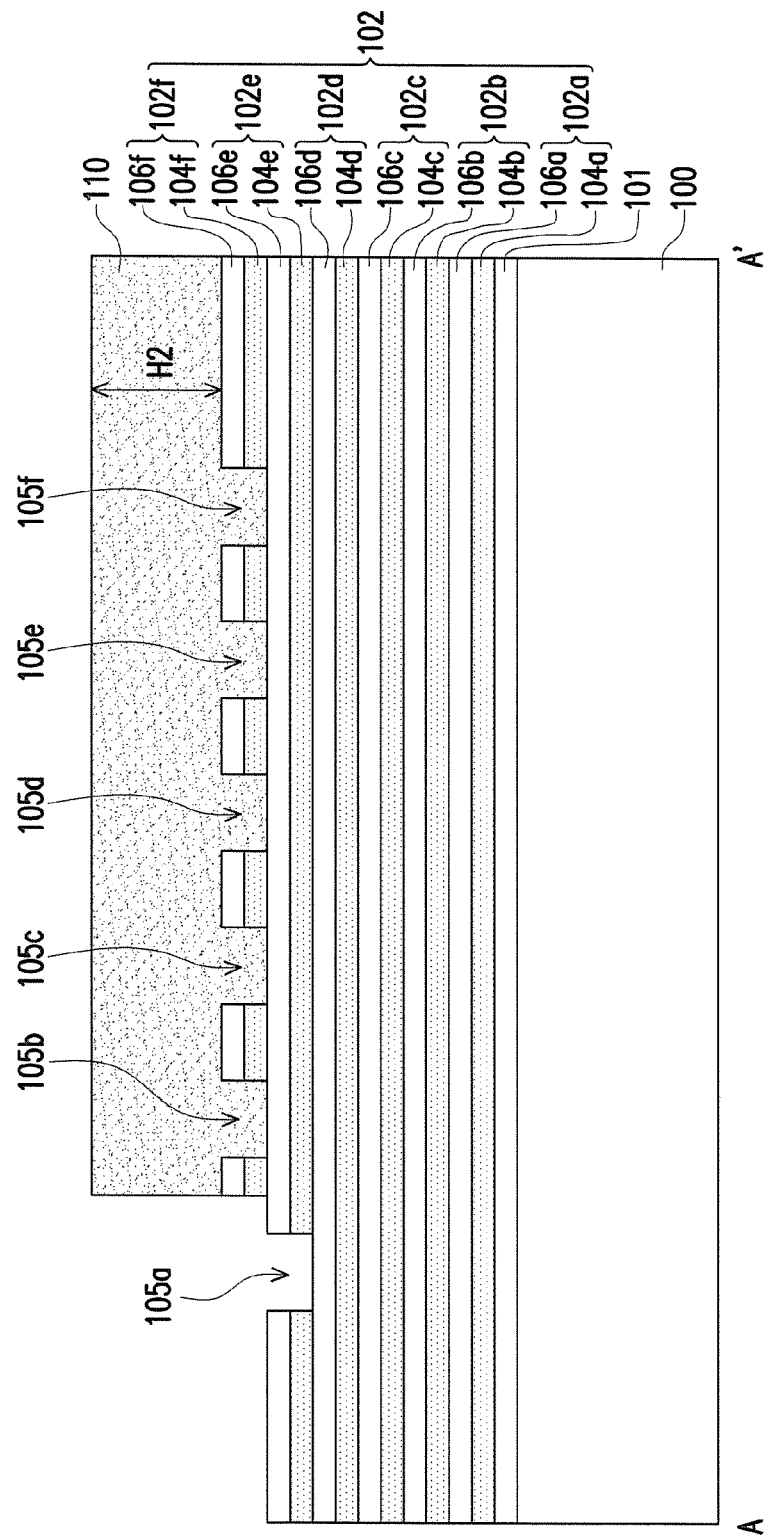

With reference to FIG. 3D and FIG. 3E, a first etching process is performed by using the photoresist layer 110 as a mask, and a portion of the material pair 102f exposed by the photoresist layer 110 and a portion of the material pair 120e exposed by the opening 105a are removed, such that a shape of the opening 105a is transferred into the material pair 102e. The opening 105a transferred into the material pair 120e exposes the top surface of the material pair 102d (or the second layer 106d). As shown in FIG. 3E, the photoresist layer 110 is etched as well, such that the thickness or the height H2 of the photoresist layer 110 is reduced to 3950 nm-5950 nm. In an embodiment of the invention, the first etching process may include a dry etching process, e.g., an RIE process, for instance. According to an embodiment, the first etching process may include two etching steps. For instance, the first etching process may be performed to remove the second layer with use of the first layer as an etching stop layer. The first layer is then removed with use of the second layer as an etching stop layer. Thereby, during the first etching process, one material pair can be removed. However, the invention should not be limited thereto; in other embodiments, the manufacturing parameters of the first etching process can be adjusted to remove the required thickness of or the required number of the material pairs.

Figure 3F:
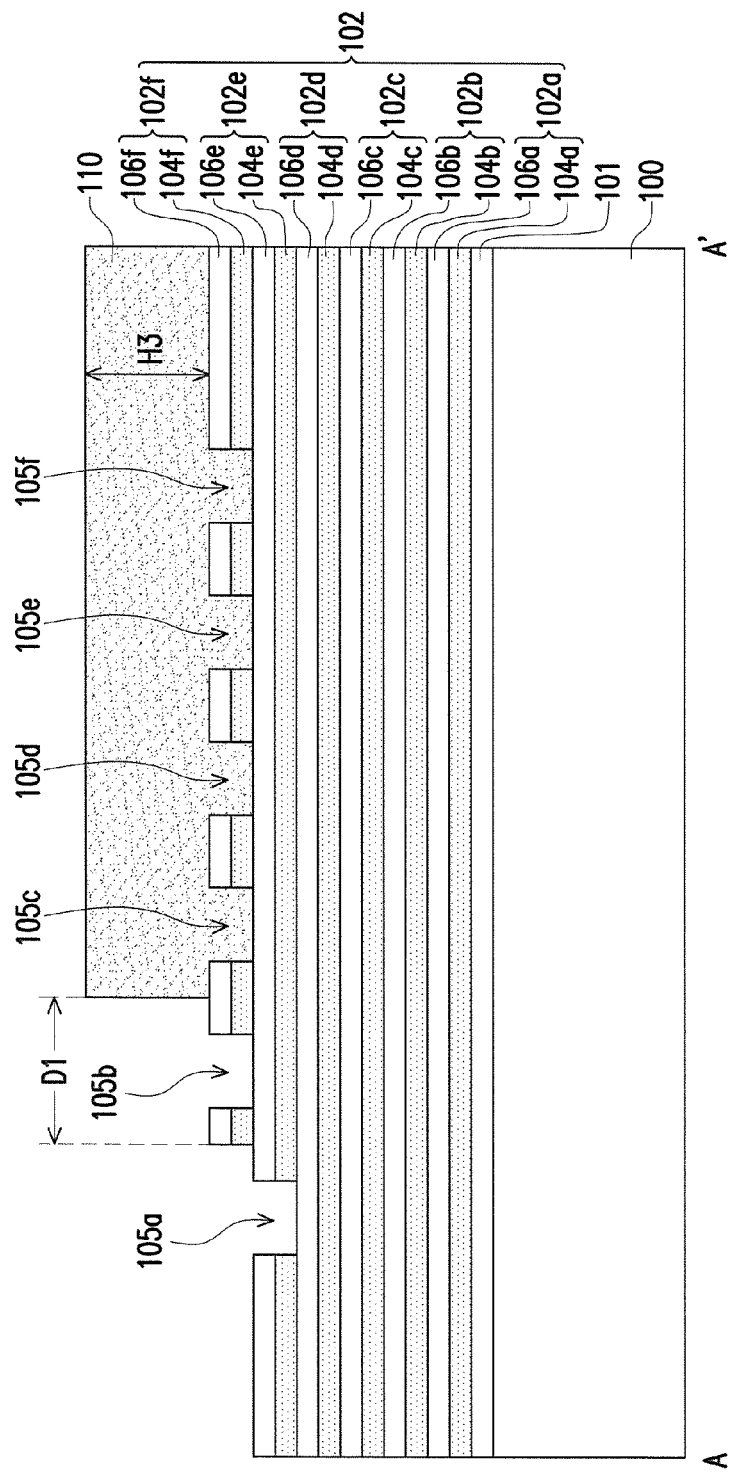

With reference to FIG. 3E and FIG. 3F, the photoresist layer 110 is trimmed to expose the opening 105b. The trimming process refers to a step of pulling back the photoresist layer 110 by one distance D1. In this case, as shown in FIG. 3F, the photoresist layer 110 exposes the openings 105a and 105b. In an embodiment, the distance D1 may be in a range of 400 nm to 600 nm, for example. The photoresist layer 110 is trimmed and pulled back, while the thickness of the photoresist layer 110 is also reduced. A reduced thickness of the photoresist layer 110 (i.e., a value of the thickness H2 minus the thickness H3) is greater than the distance D1. In an embodiment, the distance D1 may be 500 nm, while the reduced thickness of the photoresist layer 110 may be 625 nm, for example. After trimming the photoresist layer 110, the thickness or the height H3 of the photoresist layer 110 is reduced to 3325 nm-5325 nm. That is, the greater the thickness or the height H1 of the photoresist layer 110 is, the more number of times the patterning process can be performed, so as to form the stair step structure with more stair steps. Hence, the thickness or the height H1 of the photoresist layer 110 may be adjusted according to actual demands.

Figure 3G:
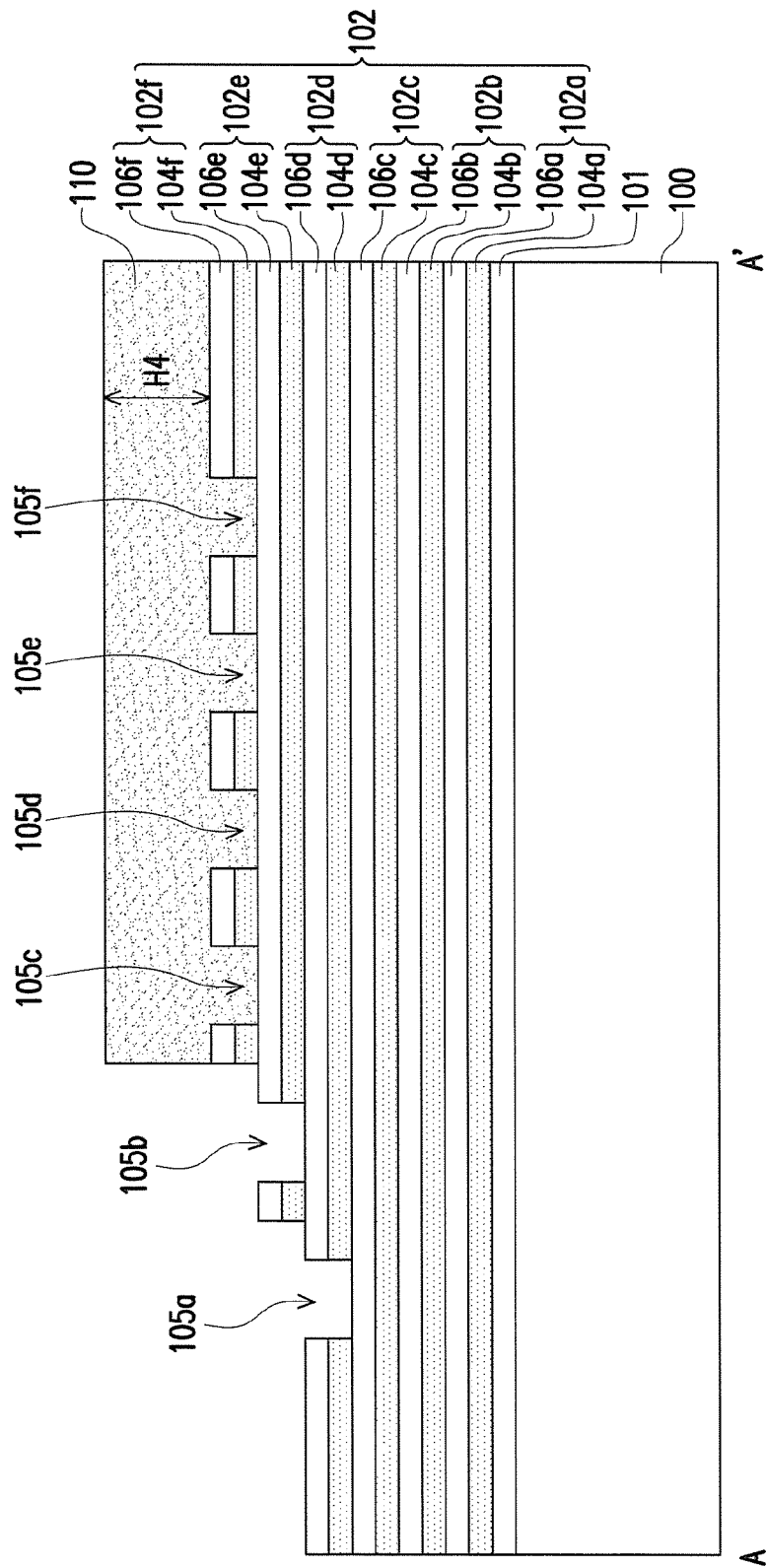

With reference to FIG. 3F and FIG. 3G, a second etching process is performed by using the photoresist layer 110 as a mask, and a portion of the material pair 102f, a portion of the material pair 120e, and a portion of the material pair 102d are removed, such that the shape of the opening 105a is transferred into the material pair 102d and a shape of the opening 105b is transferred into the material pair 102e. In this case, as shown in FIG. 3G, the opening 105a transferred to the material pair 102d exposes the top surface of the material pair 102c (or the second layer 106c), and the opening 105b transferred to the material pair 102e exposes the top surface of the material pair 102d (or the second layer 106d). As shown in FIG. 3G, the photoresist layer 110 is etched as well, such that the thickness or the height H4 of the photoresist layer 110 is reduced to 3275 nm-5275 nm.

Figure 3H:
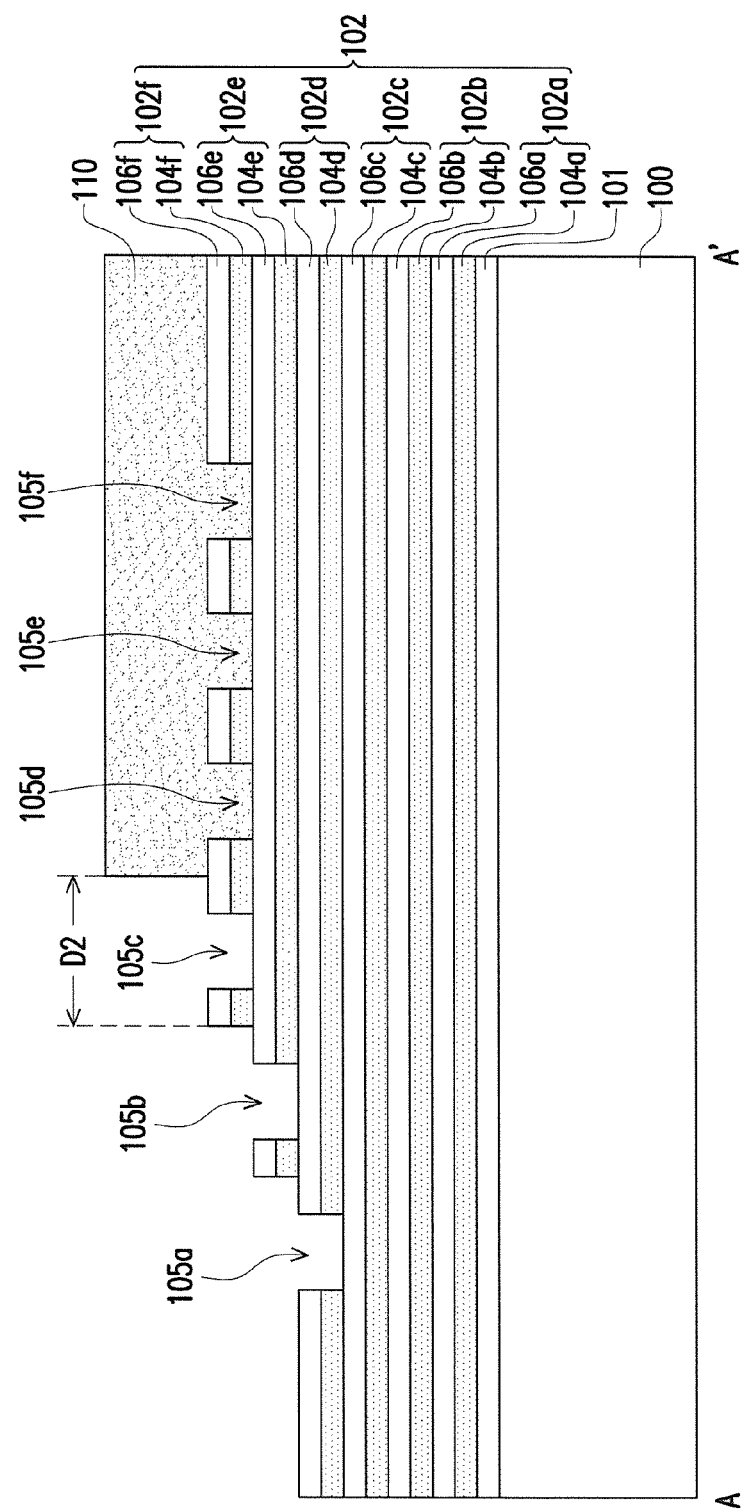

With reference to FIG. 3G and FIG. 3H, the photoresist layer 110 is trimmed, such that the photoresist layer 110 is pulled back by a distance D2 to expose the opening 105c. In an embodiment, the distance D2 may be in a range of 400 nm to 600 nm, for example.

Figure 3I:
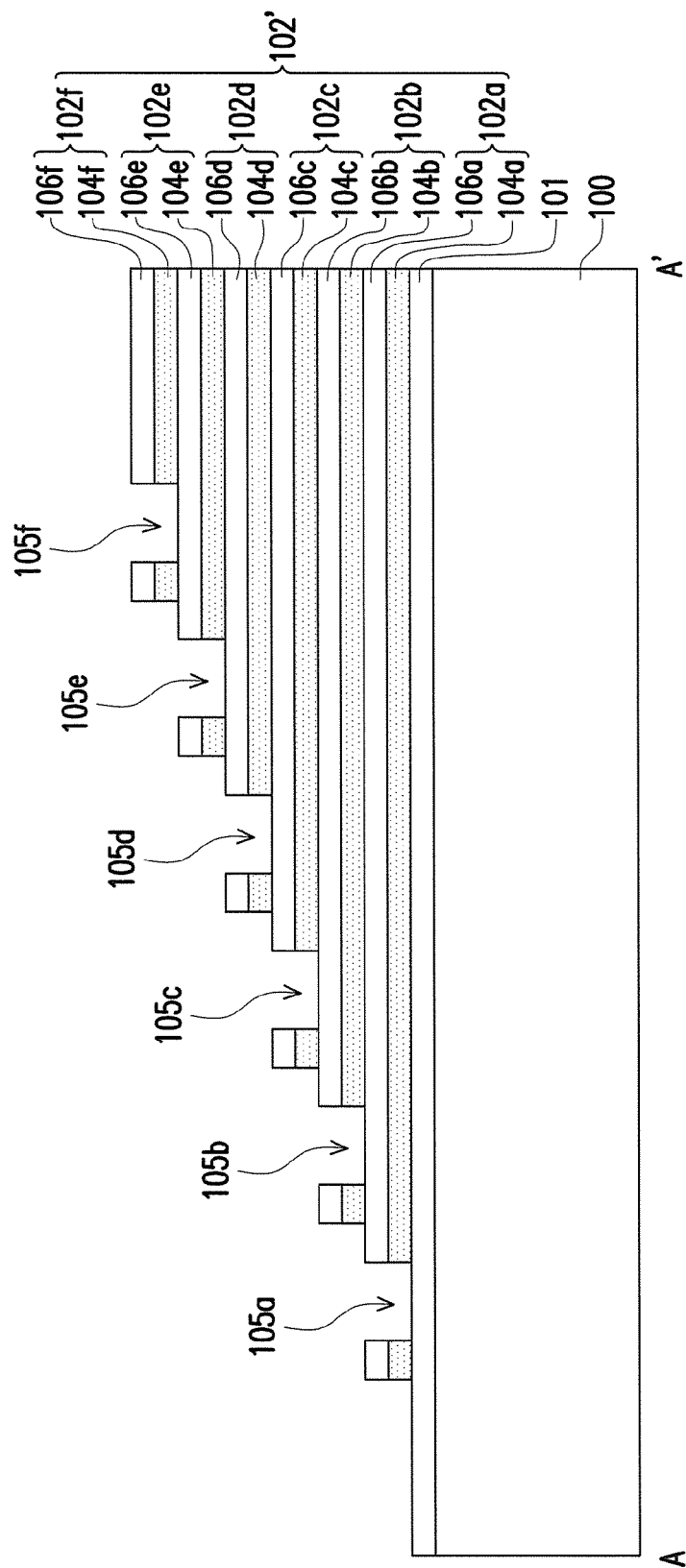

With reference to FIG. 3H and FIG. 3I, the step of performing the second etching process and the step of trimming the photoresist layer 110 are repeated until the stair step structure 102' shown in FIG. 3I is formed. In this case, as shown in FIG. 3I, the openings 105a-105f are respectively located in each stair step of the stair step structure 102'.

Figure 3J:
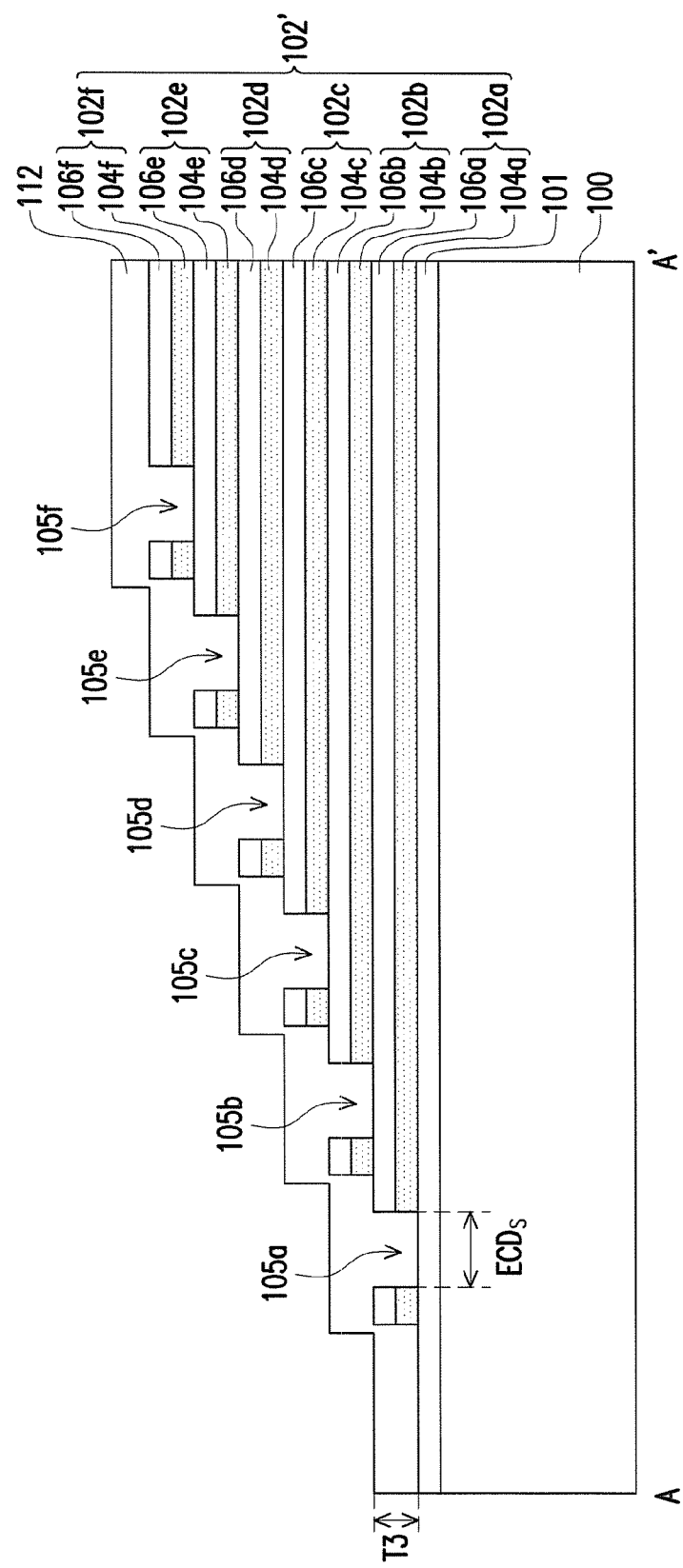

With reference to FIG. 3I and FIG. 3J, an insulation layer 112 is formed on the substrate 100. The insulation layer 112 covers the surface of the stair step structure 102' and fills into the openings 105a-105f. In an embodiment of the invention, a thickness T3 of the insulation layer 112 may be greater than half the width ECDs of the opening 105a, so as to make sure the openings 105a-105f full. In another aspect, as shown in FIG. 3J, the thickness T3 of the insulation layer 112 must be greater than the thickness of the material pair 102a, such that the opening 105a can be filled with the insulation layer 112. According to an embodiment, the insulation layer 112 includes silicon nitride, and a method of fabricating the insulation layer 112 is, for example, a chemical vapor deposition (CVD) process.

Figure 3K:
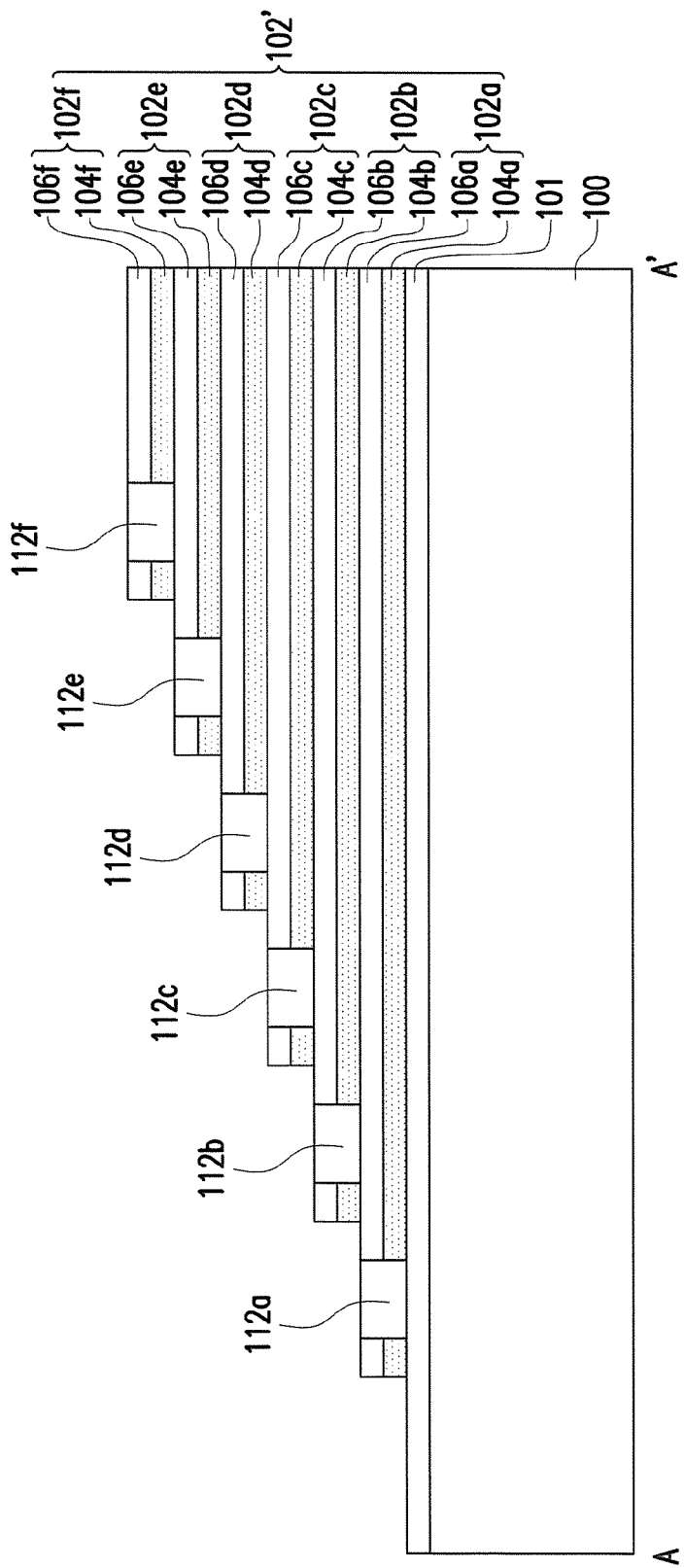

With reference to FIG. 3J and FIG. 3K, a portion of the insulation layer 112 is removed to respectively form the third layers 112a-112f in the openings 105a-105f. In an embodiment, as shown in FIG. 3K, the top surface of the third layer 112a and the top surface of the material pair 102a are co-planar. Similarly, in an embodiment, the top surface of the third layer 112b and the top surface of the material pair 102b are co-planar. The top surfaces of other third layers and the top surfaces of the corresponding material pairs are also co-planar and thus will not be further explained.

Figure 3L:
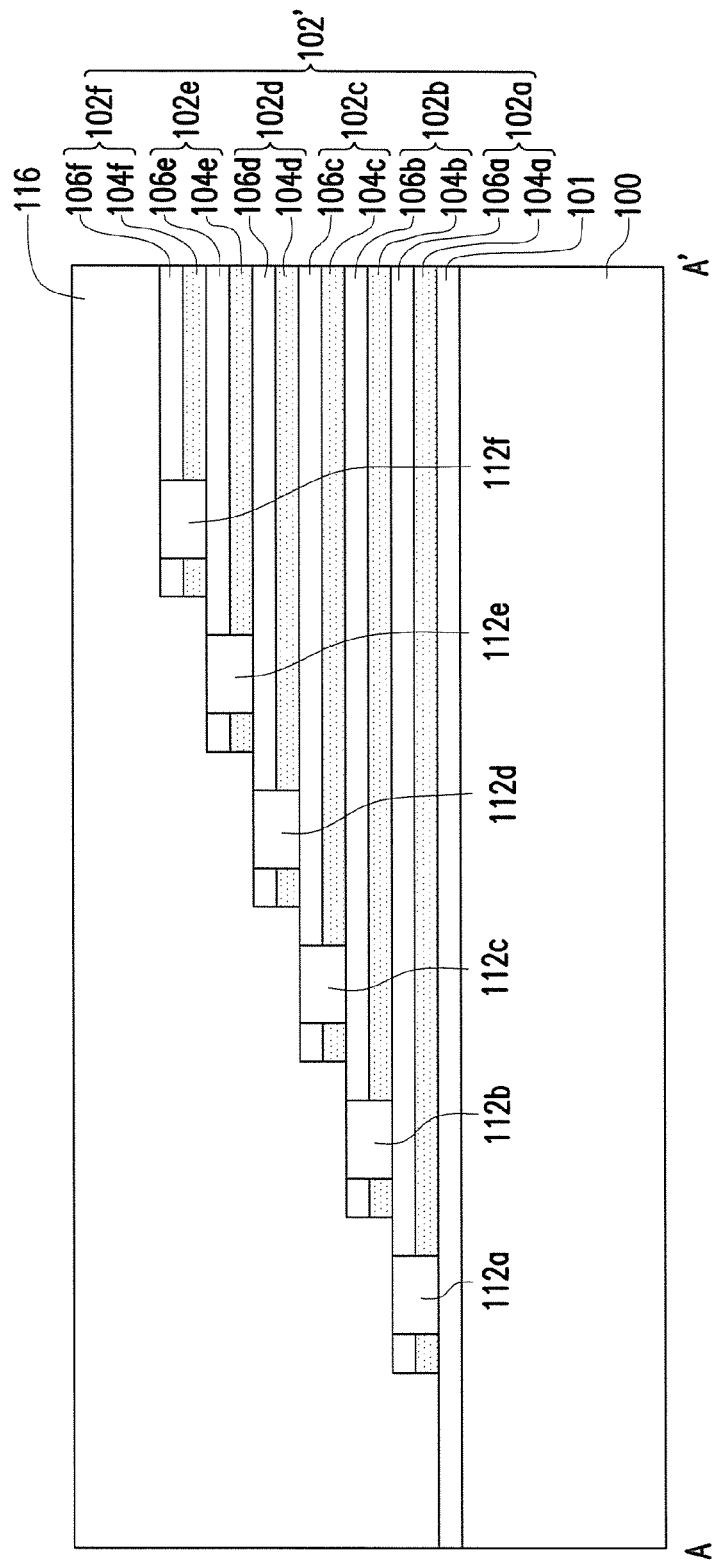

With reference to FIG. 3K and FIG. 3L, a dielectric layer 116 is formed on the substrate 100. The dielectric layer 116 covers a surface of the stair step structure 102' and the top surfaces of the third layers 112a-112f. According to an embodiment, the dielectric layer 116 includes silicon nitride, and a method of fabricating the dielectric layer 116 is that deposing a dielectric material layer on the substrate 100 by using a CVD process, for example. A planarization process (e.g., CMP) is then performed to planar a top surface of the dielectric material layer.

Figure 3M:
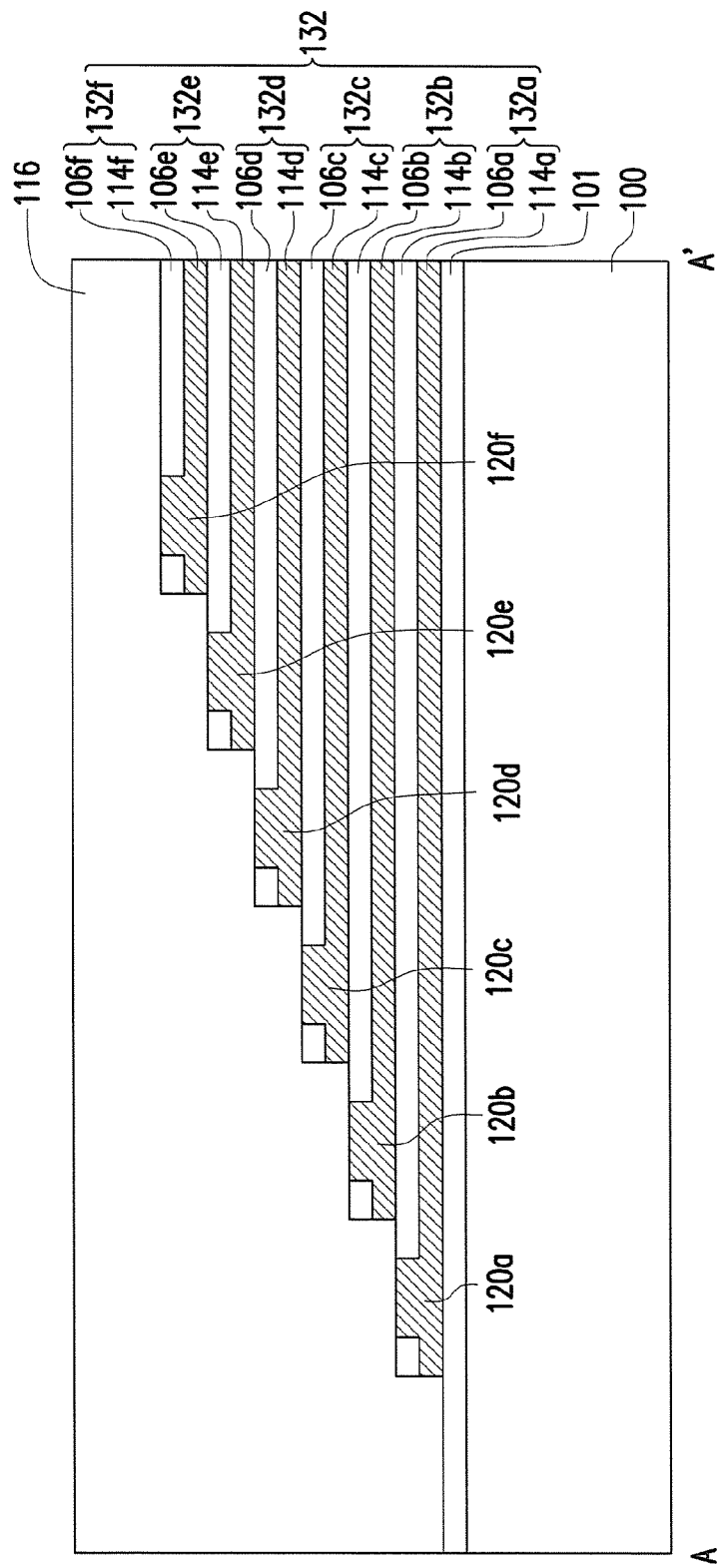

With reference to FIG. 3L and FIG. 3M, a tungsten replacement process is performed to replace the first layers 104a-104f and the third layers 112a-112f with tungsten (W). Particularly, the tungsten replacement process is explained hereinafter. The slits 130 are formed in the dielectric layer 116 and the stair step structure 102'. Although the cross-sectional view in FIG. 3M does not show the slits 130, it can be learned from FIG. 1 that the extension direction of the slits 130 is parallel to the direction of the line A-A' line. The slits 130 extend to a bottom surface of the stair step structure 102', so as to expose a partial cross-section of the first layers 104a-104f of the material pairs 102a-102f. An etchant is added into the slits 130, and the first layers 104a-104f and the third layers 112a-112f are removed to form a plurality of gaps (not shown). A deposition process is performed to form a plurality of tungsten layers in the gaps. As shown in FIG. 3M, after the tungsten replacement process is performed, the first layers 104a-104f are replaced with the conductive layers 114a-114f, and the third layers 112a-112f are replaced with the pads 120a-120f. According to the present embodiment, the material of the conductive layer 114a-114f and the material of the pads 120a-120f are the same, i.e., tungsten (W). In an embodiment, the etchant may be hydrofluoric acid, hot phosphoric acid, or a combination thereof. In an embodiment, a step of using the etchant may include applying hydrofluoric acid, then applying hot phosphoric acid.

In an alternative embodiment, if the first layers 104a-104f are polysilicon layers, and the second layers 106a-106f are silicon oxide layers, it is likely not to perform the tungsten replacement process. At this time, the pads 120a-120f may be made of polysilicon, for instance.

Figure 3N:
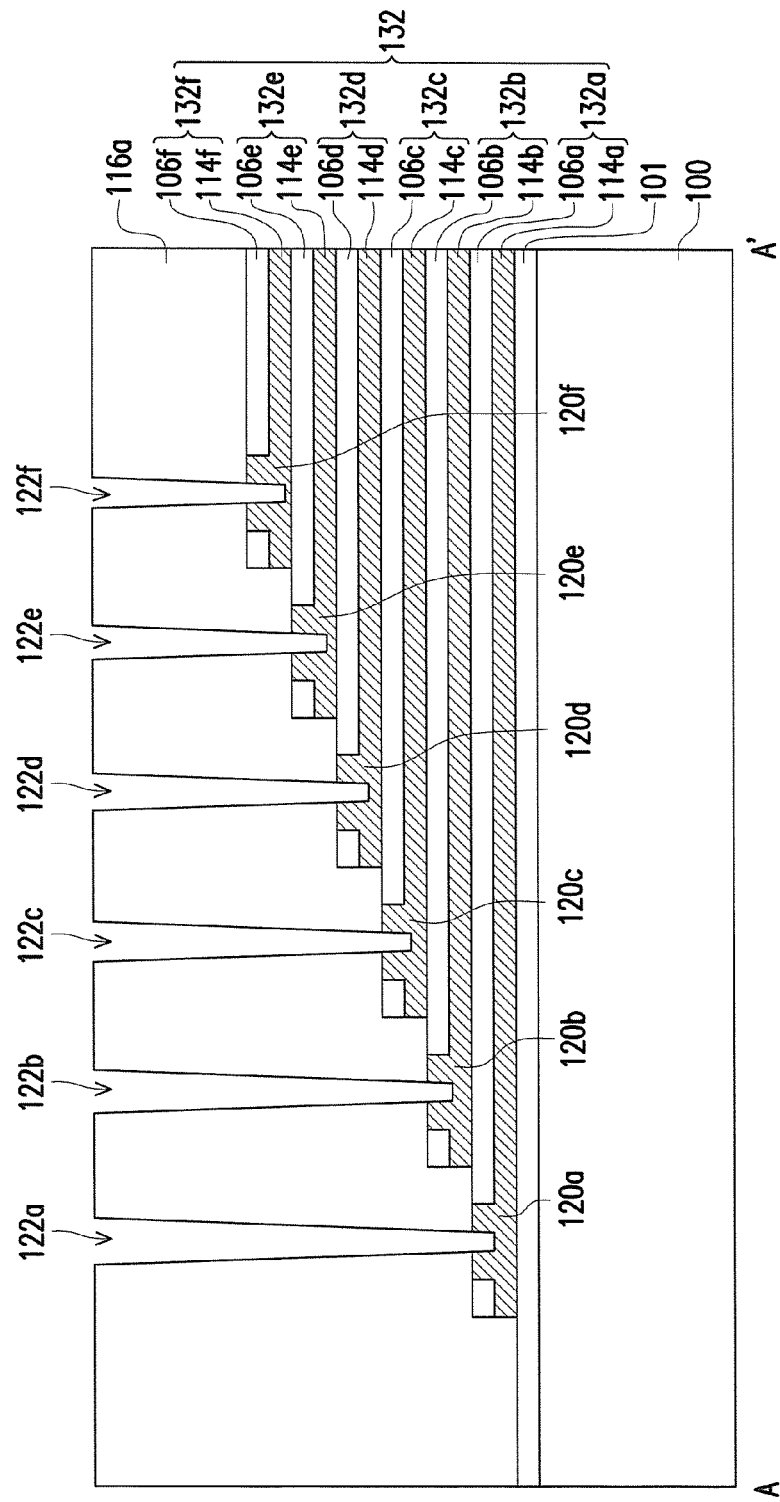
Figure 30:
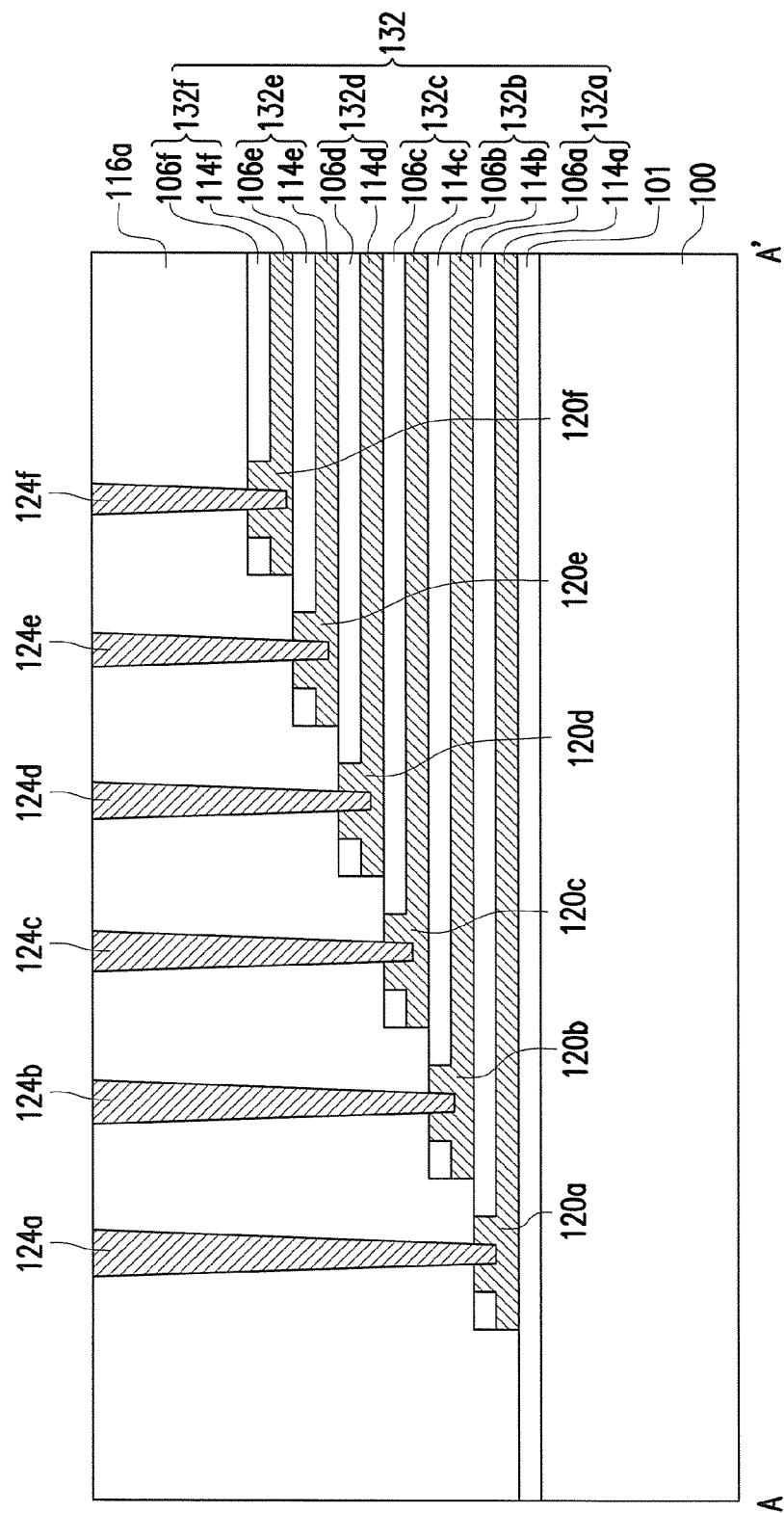

With reference to FIG. 3M and FIG. 3N, a plurality of contact openings 122a-122f are formed in the dielectric layer 116a. The contact openings 122a-122f respectively expose the surfaces of the pads 120a-120f. It can be learned from FIG. 3N that the pads 120a-120f may serve as the etching stop layer while the contact openings 122a-122f are formed. Compared to the distance between the top surface of the pad 120a and the top surface of the dielectric layer 116a, the distance between the top surface of the pad 120f and the top surface of the dielectric layer 116a is smaller; hence, during the manufacturing process of the contact openings, the contact window opening 122f firstly touches the top surface of the topmost pad 120f, such that the etching loss of the topmost pad 120f is more than other pads 120a-120e. Compared to the thickness of the conventional pads, the thickness of the pads 120a-120f is greater, so as to prevent the over-etching during the manufacturing process of the contact openings (especially the over-etching of the topmost pad 120f). Thereby, the fabrication window and the yield can be improved. Before the contact openings 122a-122f are formed, other manufacturing processes may be performed; therefore, the thickness of the dielectric layer 116a shown in FIG. 3N is greater than the thickness of the dielectric layer 116 shown in FIG. 3M.

With reference to FIG. 3N and FIG. 3O, the contact openings 122a-122f are filled with the plugs 124a-124f respectively, such that the plugs 124a-124f are respectively connected to the corresponding pads 120a-120f. Hence, the plugs 124a-124f may be electrically connected to the corresponding conductive layers 114a-114f through the corresponding pads 120a-120f. The pads 120a-120f and the plugs 124a-124f may serve as interconnection structures to electrically connect components in each stair step of the material pairs 132 having the stair step structure to other components. Particularly, the step of filling the contact openings 122a-122f with the plugs 124a-124f includes performing a deposition process, so as to fill a metal material into the contact openings 122a-122f and cover the top surface of the dielectric layer 116a. A planarization process is then performed to remove the metal material on the top surface of the dielectric layer 116a. As shown in FIG. 3O, the top surfaces of the plugs 124a-124f and the top surface of the dielectric layer 116a are co-planar. In an embodiment, the metal material includes W, and a method of forming the metal material may be a physical vapor deposition (PVD) process or a CVD process. The planarization process may be a chemical mechanical polishing (CMP) process, for example. According to an embodiment, the material of the plugs 124a-124f and the material of the pads 120a-120f are the same. In an alternative embodiment, the material of the plugs 124a-124f and the material of the pads 120a-120f may be different.

Figure 8A:
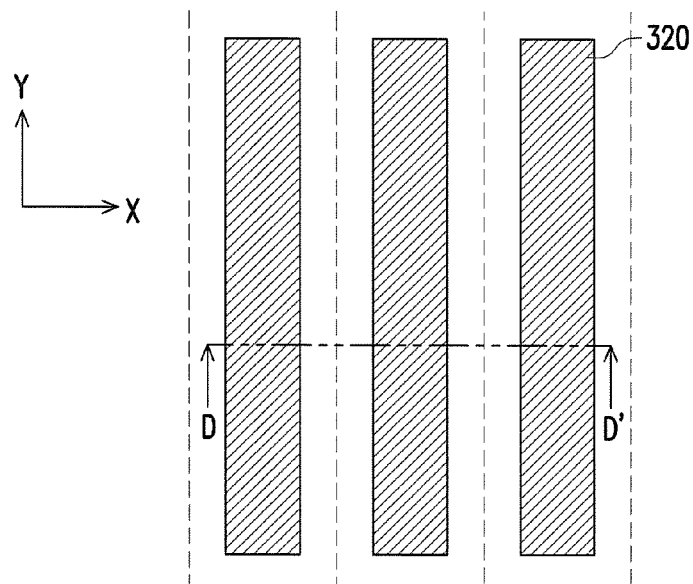
Figure 9A:
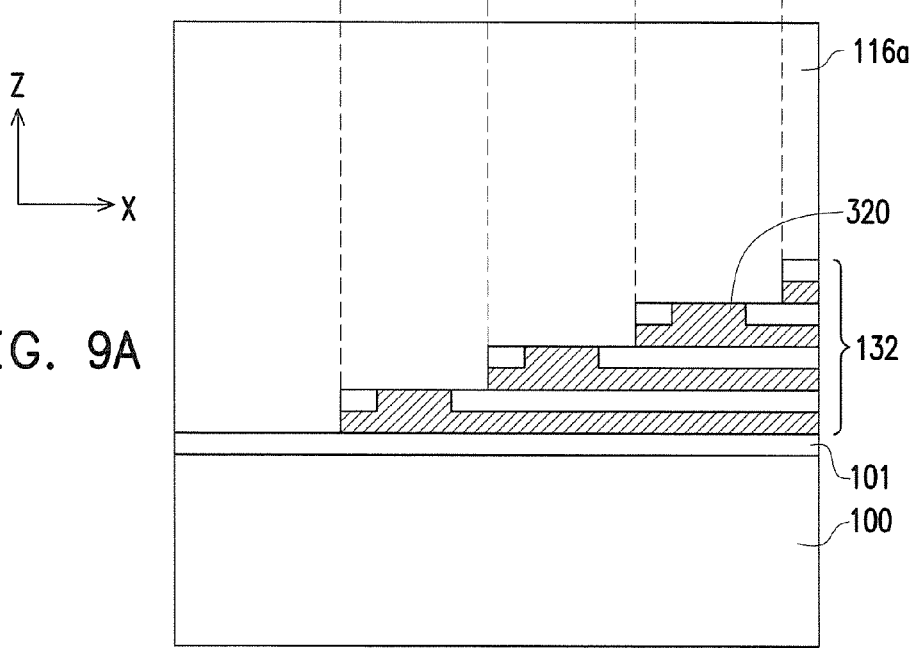

FIG. 4A and FIG. 4B are schematic top views illustrating a manufacturing process of a pad structure according to a first embodiment of the invention. FIG. 5A and FIG. 5B are schematic cross-sectional views taken along a line B-B' depicted in FIG. 4A and FIG. 4B. FIG. 6A and FIG. 6B are schematic top views illustrating a manufacturing process of a pad structure according to a second embodiment of the invention. FIG. 7A and FIG. 7B are schematic cross-sectional views taken along a line C-C' depicted in FIG. 6A and FIG. 6B. FIG. 8A and FIG. 8B are schematic top views illustrating a manufacturing process of a pad structure according to a third embodiment of the invention. FIG. 9A and FIG. 9B are schematic cross-sectional views taken along a line D-D' depicted in FIG. 8A and FIG. 8B.

Note that the shape of the pads observed at a top view angle includes a square shape (as shown in FIG. 4A), a rectangular shape (as shown in FIG. 6A), a bar shape (as shown in FIG. 8A), or a combination thereof. A width of one of the pads is greater than a bottom width of a corresponding plug (or contact opening) of the plugs (or contact openings).

Please refer to FIG. 4A, FIG. 4B, FIG. 5A, and FIG. 5B. In the first embodiment, the pads 120 and the corresponding contact openings 122 have the square shape. According to an embodiment of the invention, the width ECDs of the pads 120 is greater than the sum of the width ECDc of the contact openings 122 and two specification values S (i.e., ECDs>ECDc+2S). The so-called specification value S refers to an overlay specification value or an overlay tolerance value and is determined by the exposure machine that is applied to perform the manufacturing process of the contact openings. For instance, when the exposure machine applied to perform the manufacturing process of the contact openings is a 193 nm-ArF excimer laser stepper (manufactured by ASML, model 1450H), the specification value S may be in a range of 10 nm to 20 nm, for instance. It should be noted that the pads 120 are the square shape, but the pads 120 eventually formed may be circular shape.

Please refer to FIG. 6A, FIG. 6B, FIG. 7A, and FIG. 7B. In the second embodiment, the pads 220 have the rectangular shape, and the corresponding contact openings 122 have the square shape. According to an embodiment of the invention, the width ECDs of the pads 220 is greater than the sum of the width ECDc of the contact openings 122 and two specification values S (i.e., ECDs>ECDc+2S).

Please refer to FIG. 8A, FIG. 8B, FIG. 9A, and FIG. 9B. In the third embodiment, the pads 320 have the bar shape, and the corresponding contact openings 122 have the square shape. The bar-shaped pads 320 are arranged in the X direction and extend along the Y direction. According to an embodiment of the invention, the width ECDs of the pads 320 is greater than the sum of the width ECDc of the contact openings 122 and two specification values S (i.e., ECDs>ECDc+2S).

To sum up, according to an embodiment of the invention, plural openings may be formed in the topmost material pair of the stacked structure. The stacked structure is patterned to form the stair step structure, and the openings are transferred and formed in each stair step of the stair step structure. The openings are then filled with a conductive material to form the pads. Compared to the conventional pads, the pads provided herein have larger thickness, so as to prevent electrical failures caused by over-etching during the process of manufacturing the contact openings. Besides, the thicker pads used as the etching stop layer of forming the contact openings may increase the fabrication window and the yield of the manufacturing process of the contact openings.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:
1. A pad structure comprising:
a plurality of material pairs stacked on a substrate to form a stair step structure, a stair step of the stair step structure comprising one of the material pairs, each of the material pairs comprising a conductive layer and a dielectric layer located on the conductive layer;

a plurality of pads, each of the pads embedded in one of the stair steps of the stair step structure and exposed by the dielectric layer corresponding to the one of the stair steps and another of the stair steps above the one of the stair steps, wherein a thickness of one of the pads is greater than a thickness of one of the conductive layers; and a pad layer located between the stair step structure and the substrate.

2. The pad structure according to claim 1, wherein the material pairs extend along an X-Y plane, and one of the material pairs protrudes from a side of another of the material pairs above the one of the material pairs and exposes a surface of a corresponding pad of the pads.

3. The pad structure according to claim 2, further comprising a plurality of plugs extending along a Z direction, the plugs being respectively arranged on the pads.

4. The pad structure according to claim 3, wherein a width of each of the pads is greater than a bottom width of a corresponding plug of the plugs.

5. The pad structure according to claim 3, wherein a material of the plugs is the same as a material of the pads.

6. The pad structure according to claim 3, wherein a material of the plugs is different from a material of the pads.

7. The pad structure according to claim 1, wherein a shape of the pads observed at a top view angle comprises a square shape, a rectangular shape, a bar shape, or a combination thereof.

8. The pad structure according to claim 1, wherein when a shape of the pads observed at a top view angle is a bar shape, the pads are arranged along an X direction and extend along a Y direction.

9. A manufacturing method of a pad structure, comprising:

forming a stacked structure on a substrate, the stacked structure comprising a plurality of stacked material pairs, the material pairs comprising a first material pair to an Nth material pair from top to bottom, N being an integer greater than 1, wherein each of the material pairs comprises a first layer and a second layer located on the first layer;

forming a plurality of first openings in the first material pair, the first openings exposing a top surface of the second material pair;

performing a patterning process to pattern the stacked structure and form a stair step structure, and forming a second opening in each of a plurality of stair steps of the stair step structure, wherein locations of orthogonal projections of the second openings respectively correspond to locations of the first openings;

filling the second openings with a plurality of third layers respectively, wherein a thickness of one of the third layers is greater than a thickness of one of the first layers; and forming a pad layer between the stair step structure and the substrate.

10. The manufacturing method according to claim 9, after filling the second openings with the third layers respectively, the method further comprising:

forming a dielectric layer on the substrate, the dielectric layer covering a surface of the stair step structure and top surfaces of the third layers;

forming a plurality of contact openings in the dielectric layer, the contact openings respectively exposing the top surfaces of the third layers; and filling the contact openings with a plurality of plugs respectively, such that one of the plugs is connected to a corresponding third layer of the third layers.

11. The manufacturing method according to claim 10, wherein each of the first layers comprises silicon nitride, each of the second layers comprises silicon oxide, and each of the third layers comprises silicon nitride.

12. The manufacturing method according to claim 11, wherein after the dielectric layer is formed on the substrate and before the contact openings are formed, the manufacturing method further comprises performing a tungsten replacement process to replace the first layers and the third layers with tungsten.

13. The manufacturing method according to claim 12, wherein the tungsten replacement process comprises:

forming at least one slit in the dielectric layer and the stair step structure, the at least one slit extending to a bottom surface of the stair step structure, so as to expose a partial cross-section of the first layers of the material pairs;

adding an etchant into the at least one slit and removing the first layers and the third layers to form a plurality of gaps; and performing a deposition process to form a plurality of tungsten layers in the gaps respectively.

14. The manufacturing method according to claim 10, wherein each of the first layers comprises polysilicon, each of the second layers comprises silicon oxide, and each of the third layers comprises polysilicon.

15. The manufacturing method according to claim 10, wherein each of the plugs comprises tungsten.

16. The manufacturing method according to claim 9, wherein the step of performing the patterning process comprises:

forming a photoresist layer on the stacked structure, the photoresist layer exposing one of the first openings;

performing a first etching process and removing a portion of the first material pairs and a portion of the second material pairs, so as to transfer a shape of the one of the first openings into the second material pairs;

trimming the photoresist layer to expose another one of the first openings;

performing a second etching process and removing a portion of the first material pairs, a portion of the second material pairs, and a portion of the third material pairs, so as to transfer a shape of the another one of the first openings into the second material pairs and transfer the shape of the one of the first openings into the third material pairs; and repeating the step of trimming the photoresist layer and the step of performing the second etching process until the stair step structure is formed.

* * * * *